(12) United States Patent
Kumar et al.

(10) Patent No.: US 12,473,633 B2
(45) Date of Patent: Nov. 18, 2025

(54) PLASMA ENHANCED ATOMIC LAYER DEPOSITION OF SILICON-CONTAINING FILMS

(71) Applicant: Lam Research Corporation, Fremont, CA (US)

(72) Inventors: Ravi Kumar, Beaverton, OR (US); Pulkit Agarwal, Beaverton, OR (US); Adrien LaVoie, Newberg, OR (US); Dustin Zachary Austin, Tigard, OR (US); Joseph R. Abel, West Linn, OR (US); Douglas Walter Agnew, Portland, OR (US); Jonathan Grant Baker, King City, OR (US)

(73) Assignee: Lam Research Corporation, Fremont, CA (US)

( * ) Notice: Subject to any disclaimer, the term of this patent is extended or adjusted under 35 U.S.C. 154(b) by 18 days.

(21) Appl. No.: 18/577,681

(22) PCT Filed: Jul. 1, 2022

(86) PCT No.: PCT/US2022/036026
§ 371 (c)(1),
(2) Date: Jan. 8, 2024

(87) PCT Pub. No.: WO2023/283144
PCT Pub. Date: Jan. 12, 2023

(65) Prior Publication Data
US 2024/0327973 A1    Oct. 3, 2024

Related U.S. Application Data

(60) Provisional application No. 63/334,774, filed on Apr. 26, 2022, provisional application No. 63/220,302, filed on Jul. 9, 2021.

(51) Int. Cl.
*C23C 16/04* (2006.01)
*C23C 16/24* (2006.01)
*C23C 16/455* (2006.01)

(52) U.S. Cl.
CPC .......... *C23C 16/045* (2013.01); *C23C 16/24* (2013.01); *C23C 16/45565* (2013.01)

(58) Field of Classification Search
CPC . C23C 16/045; C23C 16/24; C23C 16/45565; C23C 16/345; C23C 16/401;
(Continued)

(56) References Cited

U.S. PATENT DOCUMENTS

| | | |
|---|---|---|
| 4,158,717 A | 6/1979 | Nelson |
| 4,419,809 A | 12/1983 | Riseman et al. |

(Continued)

FOREIGN PATENT DOCUMENTS

| | | |
|---|---|---|
| CN | 1705768 A | 12/2005 |
| CN | 1732288 A | 2/2006 |

(Continued)

OTHER PUBLICATIONS

Aboaf, J.A. (1969) "Some Properties of Vapor Deposited Silicon Nitride Films Obtained by the Reaction of SiBr4 and NH 3," Journal of the Electrochemical Society, 116(12):1736-1740.

(Continued)

*Primary Examiner* — Michael G Miller
(74) *Attorney, Agent, or Firm* — Weaver Austin Villeneuve & Sampson LLP

(57) ABSTRACT

A method comprising: providing a substrate in a processing station comprising a substrate support and a showerhead, the substrate comprising a gap to be filled; and depositing silicon-containing film in the gap by a plasma-enhanced atomic layer deposition (PEALD) process comprising multiple cycles of operations (a)-(d): (a) a dose operation (Continued)

comprising flowing a silicon-containing precursor into the processing station via the showerhead to allow the silicon-containing precursor to adsorb onto the substrate; (b) after (a), flowing a purge gas into the processing station; (c) after (b), exposing the substrate to plasma species to react with the adsorbed silicon-containing precursor; and (d) after (c), flowing a purge gas into the processing station, wherein the silicon-containing precursor continues to flow into the processing station during at least (b).

25 Claims, 23 Drawing Sheets

(58) Field of Classification Search
CPC ........ C23C 16/45542; C23C 16/45561; H01L 21/0214; H01L 21/02164; H01L 21/0217; H01L 21/022; H01L 21/0228; H01L 21/02274; H10B 41/27; H10B 43/27
See application file for complete search history.

(56) References Cited

U.S. PATENT DOCUMENTS

| | | | |
|---|---|---|---|
| 4,500,563 A | 2/1985 | Ellenberger et al. |
| 4,575,921 A | 3/1986 | Bhagat |
| 4,869,781 A | 9/1989 | Euen et al. |
| 5,091,332 A | 2/1992 | Bohr et al. |
| 5,202,272 A | 4/1993 | Hsieh et al. |
| 5,230,929 A | 7/1993 | Caporiccio et al. |
| 5,314,724 A | 5/1994 | Tsukune et al. |
| 5,459,099 A | 10/1995 | Hsu |
| 5,496,608 A | 3/1996 | Matsuda et al. |
| 5,528,719 A | 6/1996 | Yamada |
| 5,670,432 A | 9/1997 | Tsai |
| 5,731,235 A | 3/1998 | Srinivasan et al. |
| 5,854,105 A | 12/1998 | Tseng |
| 5,856,003 A | 1/1999 | Chiu |
| 5,891,805 A | 4/1999 | Cheng et al. |
| 5,976,990 A | 11/1999 | Mercaldi et al. |
| 6,039,834 A | 3/2000 | Tanaka et al. |
| 6,080,676 A | 6/2000 | Nguyen et al. |
| 6,153,519 A | 11/2000 | Jain et al. |
| 6,197,701 B1 | 3/2001 | Shue et al. |
| 6,225,175 B1 | 5/2001 | Houston |
| 6,228,779 B1 | 5/2001 | Bloom et al. |
| 6,326,322 B1 | 12/2001 | Kim et al. |
| 6,380,056 B1 | 4/2002 | Shue et al. |
| 6,395,652 B2 | 5/2002 | Kim et al. |
| 6,403,416 B1 | 6/2002 | Huang et al. |
| 6,416,822 B1 | 7/2002 | Chiang et al. |
| 6,428,859 B1 | 8/2002 | Chiang et al. |
| 6,448,192 B1 | 9/2002 | Kaushik |
| 6,518,167 B1 | 2/2003 | You et al. |
| 6,534,395 B2 | 3/2003 | Werkhoven et al. |
| 6,548,368 B1 | 4/2003 | Narwankar et al. |
| 6,632,478 B2 | 10/2003 | Gaillard et al. |
| 6,632,741 B1 | 10/2003 | Clevenger et al. |
| 6,638,879 B2 | 10/2003 | Hsieh et al. |
| 6,645,574 B1 | 11/2003 | Lee et al. |
| 6,709,928 B1 | 3/2004 | Jenne et al. |
| 6,730,614 B1 | 5/2004 | Lim et al. |
| 6,794,284 B2 | 9/2004 | Vaartstra |
| 6,926,798 B2 | 8/2005 | Biberger et al. |
| 6,933,245 B2 | 8/2005 | Lee et al. |
| 6,967,159 B2 | 11/2005 | Vaartstra |
| 7,019,159 B2 | 3/2006 | Dussarrat et al. |
| 7,041,335 B2 | 5/2006 | Chung |
| 7,169,704 B2 | 1/2007 | Koo et al. |
| 7,172,792 B2 | 2/2007 | Wang et al. |
| 7,211,525 B1 | 5/2007 | Shanker et al. |
| 7,294,582 B2 | 11/2007 | Haverkort et al. |
| 7,297,641 B2 | 11/2007 | Todd et al. |
| 7,300,885 B2 | 11/2007 | Hasebe et al. |
| 7,301,210 B2 | 11/2007 | Abadeer et al. |
| 7,351,668 B2 | 4/2008 | Chou et al. |
| 7,459,100 B2 | 12/2008 | Kiermasz et al. |
| 7,462,571 B2 | 12/2008 | Hasebe et al. |
| 7,465,669 B2 | 12/2008 | Iyer et al. |
| 7,482,247 B1 | 1/2009 | Papasouliotis et al. |
| 7,507,676 B2 | 3/2009 | Chou et al. |
| 7,510,984 B2 | 3/2009 | Saito et al. |
| 7,514,366 B2 | 4/2009 | Trivedi et al. |
| 7,611,980 B2 | 11/2009 | Wells et al. |
| 7,622,369 B1 | 11/2009 | Lee et al. |
| 7,625,820 B1 | 12/2009 | Papasouliotis et al. |
| 7,629,267 B2 | 12/2009 | Wan et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,700,492 B2 | 4/2010 | Kikuchi |
| 7,708,859 B2 | 5/2010 | Huang et al. |
| 7,713,592 B2 | 5/2010 | Nguyen et al. |
| 7,732,343 B2 | 6/2010 | Niroomand et al. |
| 7,758,920 B2 | 7/2010 | Hasebe et al. |
| 7,790,633 B1 | 9/2010 | Tarafdar et al. |
| 7,807,578 B2 | 10/2010 | Bencher et al. |
| 7,825,039 B2 | 11/2010 | Takahashi et al. |
| 7,910,288 B2 | 3/2011 | Abatchev et al. |
| 7,910,497 B2 | 3/2011 | Olsen et al. |
| 7,919,416 B2 | 4/2011 | Lee et al. |
| 7,939,455 B2 | 5/2011 | Clark |
| 7,964,241 B2 | 6/2011 | Hasebe et al. |
| 7,964,513 B2 | 6/2011 | Todd et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,084,088 B2 | 12/2011 | Huy et al. |
| 8,088,248 B2 | 1/2012 | Larson |
| 8,105,901 B2 | 1/2012 | Cheng et al. |
| 8,119,544 B2 | 2/2012 | Hasebe et al. |
| 8,129,555 B2 | 3/2012 | Cheng et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,298,628 B2 | 10/2012 | Yang et al. |
| 8,298,954 B1 | 10/2012 | Arnold et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,580,699 B2 | 11/2013 | Mallick |
| 8,592,328 B2 | 11/2013 | Hausmann et al. |
| 8,623,770 B1 | 1/2014 | Gao et al. |
| 8,669,185 B2 | 3/2014 | Onizawa et al. |
| 8,703,578 B2 | 4/2014 | Hoentschel et al. |
| 8,728,955 B2 | 5/2014 | Lavoie et al. |
| 8,728,956 B2 | 5/2014 | Lavoie et al. |
| 8,753,984 B2 | 6/2014 | Murakami et al. |
| 8,791,034 B2 | 7/2014 | Shealy et al. |
| 8,802,882 B2 | 8/2014 | Wang et al. |
| 8,846,484 B2 | 9/2014 | Lee et al. |
| 8,936,977 B2 | 1/2015 | Hoentschel et al. |
| 8,975,704 B2 | 3/2015 | Hoentschel et al. |
| 9,023,693 B1 | 5/2015 | Lin et al. |
| 9,023,737 B2 | 5/2015 | Beynet et al. |
| 9,070,555 B2 | 6/2015 | Hausmann et al. |
| 9,095,869 B2 | 8/2015 | Kilpi et al. |
| 9,214,333 B1 | 12/2015 | Sims et al. |
| 9,355,839 B2 | 5/2016 | Swaminathan et al. |
| 9,379,210 B2 | 6/2016 | Mountsier et al. |
| 9,390,909 B2 | 7/2016 | Pasquale et al. |
| 9,406,693 B1 | 8/2016 | Pang et al. |
| 9,443,731 B1 | 9/2016 | O'Meara et al. |
| 9,472,506 B2 | 10/2016 | Conklin et al. |
| 9,502,234 B2 | 11/2016 | Xiao et al. |
| 9,502,238 B2 | 11/2016 | Danek et al. |
| 9,508,604 B1 | 11/2016 | Sung et al. |
| 9,530,663 B1 | 12/2016 | Shih et al. |
| 9,564,312 B2 | 2/2017 | Henri et al. |
| 9,576,817 B1 | 2/2017 | Cheng et al. |
| 9,589,790 B2 | 3/2017 | Henri et al. |
| 9,601,693 B1 | 3/2017 | Henri et al. |
| 9,611,544 B2 | 4/2017 | Lavoie et al. |

(56) References Cited

U.S. PATENT DOCUMENTS

| | | |
|---|---|---|
| 9,670,579 B2 | 6/2017 | Hausmann et al. |
| 9,721,784 B2 | 8/2017 | Behera et al. |
| 9,865,455 B1 | 1/2018 | Sims et al. |
| 9,865,815 B2 | 1/2018 | Hausmann |
| 9,875,891 B2 | 1/2018 | Henri et al. |
| 9,892,933 B2 | 2/2018 | Peng et al. |
| 9,905,415 B2 | 2/2018 | Chandra et al. |
| 10,074,543 B2 | 9/2018 | Mahorowala et al. |
| 10,134,579 B2 | 11/2018 | Baldasseroni et al. |
| 10,141,505 B2 | 11/2018 | Hausmann |
| 10,269,559 B2 | 4/2019 | Abel et al. |
| 10,410,872 B2 | 9/2019 | Cheng et al. |
| 10,454,029 B2 | 10/2019 | McKerrow et al. |
| 10,559,465 B2 | 2/2020 | Cheng et al. |
| 10,629,435 B2 | 4/2020 | Swaminathan et al. |
| 10,658,172 B2 | 5/2020 | Abel et al. |
| 10,804,099 B2 | 10/2020 | Henri et al. |
| 10,832,908 B2 | 11/2020 | LaVoie |
| 2001/0028922 A1 | 10/2001 | Sandhu |
| 2002/0001889 A1 | 1/2002 | Kim et al. |
| 2002/0001929 A1 | 1/2002 | Biberger et al. |
| 2002/0066411 A1 | 6/2002 | Chiang et al. |
| 2002/0068466 A1 | 6/2002 | Lee et al. |
| 2003/0034244 A1 | 2/2003 | Yasar et al. |
| 2003/0092280 A1 | 5/2003 | Lee et al. |
| 2003/0116421 A1 | 6/2003 | Xu et al. |
| 2003/0143841 A1 | 7/2003 | Yang et al. |
| 2004/0043570 A1 | 3/2004 | Fujisaki et al. |
| 2004/0077184 A1 | 4/2004 | Anderson et al. |
| 2004/0096582 A1 | 5/2004 | Wang et al. |
| 2004/0121085 A1 | 6/2004 | Wang et al. |
| 2005/0025885 A1 | 2/2005 | McSwiney et al. |
| 2005/0042865 A1 | 2/2005 | Cabral, Jr. et al. |
| 2005/0059259 A1 | 3/2005 | O'Meara et al. |
| 2005/0100670 A1 | 5/2005 | Dussarrat et al. |
| 2005/0109276 A1 | 5/2005 | Iyer et al. |
| 2005/0118837 A1 | 6/2005 | Todd et al. |
| 2005/0123690 A1 | 6/2005 | Derderian et al. |
| 2005/0124109 A1 | 6/2005 | Quevedo-Lopez et al. |
| 2005/0142878 A1 | 6/2005 | Jung |
| 2005/0158983 A1 | 7/2005 | Hoshi et al. |
| 2005/0159017 A1 | 7/2005 | Kim et al. |
| 2005/0170104 A1 | 8/2005 | Jung et al. |
| 2005/0196977 A1 | 9/2005 | Saito et al. |
| 2005/0227017 A1 | 10/2005 | Senzaki et al. |
| 2005/0287309 A1 | 12/2005 | Veerasamy |
| 2005/0287775 A1 | 12/2005 | Hasebe et al. |
| 2006/0003557 A1 | 1/2006 | Cabral, Jr. et al. |
| 2006/0008656 A1 | 1/2006 | Veerasamy |
| 2006/0032442 A1 | 2/2006 | Hasebe |
| 2006/0032443 A1 | 2/2006 | Hasebe et al. |
| 2006/0046508 A1 | 3/2006 | Nemani et al. |
| 2006/0084283 A1 | 4/2006 | Paranjpe et al. |
| 2006/0088985 A1 | 4/2006 | Haverkort et al. |
| 2006/0119248 A1 | 6/2006 | Howard et al. |
| 2006/0199357 A1 | 9/2006 | Wan et al. |
| 2006/0263699 A1 | 11/2006 | Abatchev et al. |
| 2006/0269692 A1 | 11/2006 | Balseanu et al. |
| 2006/0273456 A1 | 12/2006 | Sant et al. |
| 2006/0286776 A1 | 12/2006 | Ranish et al. |
| 2006/0289385 A1 | 12/2006 | Kikuchi |
| 2007/0032047 A1 | 2/2007 | Hasebe et al. |
| 2007/0066038 A1 | 3/2007 | Sadjadi et al. |
| 2007/0099431 A1 | 5/2007 | Li |
| 2007/0137572 A1 | 6/2007 | Matsuura et al. |
| 2007/0148350 A1 | 6/2007 | Rahtu et al. |
| 2007/0148968 A1 | 6/2007 | Kwon et al. |
| 2007/0167028 A1 | 7/2007 | Chou et al. |
| 2007/0190782 A1 | 8/2007 | Park |
| 2007/0212850 A1 | 9/2007 | Ingle et al. |
| 2007/0218661 A1 | 9/2007 | Shroff et al. |
| 2007/0238299 A1 | 10/2007 | Niroomand et al. |
| 2007/0238301 A1 | 10/2007 | Cabral et al. |
| 2007/0238316 A1 | 10/2007 | Ohashi |
| 2007/0251444 A1 | 11/2007 | Gros-Jean et al. |
| 2007/0298585 A1 | 12/2007 | Lubomirsky et al. |
| 2008/0038936 A1 | 2/2008 | Todd et al. |
| 2008/0063791 A1 | 3/2008 | Hasebe et al. |
| 2008/0081470 A1 | 4/2008 | Clark |
| 2008/0119057 A1 | 5/2008 | Chua et al. |
| 2008/0124946 A1 | 5/2008 | Xiao et al. |
| 2008/0138996 A1 | 6/2008 | Nishizuka |
| 2008/0139003 A1 | 6/2008 | Pirzada et al. |
| 2008/0142483 A1 | 6/2008 | Hua et al. |
| 2008/0213479 A1 | 9/2008 | Chou et al. |
| 2008/0237726 A1 | 10/2008 | Dyer |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |
| 2008/0318443 A1 | 12/2008 | Kim et al. |
| 2009/0018668 A1 | 1/2009 | Galbraith |
| 2009/0035665 A1 | 2/2009 | Tran |
| 2009/0075490 A1 | 3/2009 | Dussarrat |
| 2009/0130797 A1 | 5/2009 | Lee et al. |
| 2009/0146322 A1 | 6/2009 | Weling et al. |
| 2009/0148625 A1 | 6/2009 | Yeom et al. |
| 2009/0155606 A1 | 6/2009 | Yoon et al. |
| 2009/0163041 A1 | 6/2009 | Mungekar et al. |
| 2009/0191722 A1 | 7/2009 | Hasebe et al. |
| 2009/0286381 A1 | 11/2009 | Van Schravendijk et al. |
| 2010/0003797 A1 | 1/2010 | Smith |
| 2010/0038727 A1 | 2/2010 | Chakravarthi et al. |
| 2010/0099271 A1 | 4/2010 | Hausmann et al. |
| 2010/0102407 A1 | 4/2010 | Kajiyama et al. |
| 2010/0124618 A1 | 5/2010 | Kobayashi et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0151681 A1 | 6/2010 | Knapp et al. |
| 2010/0221925 A1 | 9/2010 | Lee et al. |
| 2010/0267238 A1 | 10/2010 | Johnson et al. |
| 2010/0283097 A1 | 11/2010 | Endoh et al. |
| 2010/0304047 A1 | 12/2010 | Yang et al. |
| 2010/0304574 A1 | 12/2010 | Nodera et al. |
| 2010/0310791 A1 | 12/2010 | Shimazu et al. |
| 2011/0003477 A1 | 1/2011 | Park et al. |
| 2011/0014795 A1 | 1/2011 | Lee et al. |
| 2011/0021010 A1 | 1/2011 | Cheng et al. |
| 2011/0086516 A1 | 4/2011 | Lee et al. |
| 2011/0127582 A1 | 6/2011 | Cheng et al. |
| 2011/0129978 A1 | 6/2011 | Cheng et al. |
| 2011/0151142 A1 | 6/2011 | Seamons et al. |
| 2011/0159673 A1 | 6/2011 | Hanawa et al. |
| 2011/0176967 A1 | 7/2011 | Okuda et al. |
| 2011/0183528 A1 | 7/2011 | Wang et al. |
| 2011/0223769 A1 | 9/2011 | Ko et al. |
| 2011/0244142 A1 | 10/2011 | Cheng et al. |
| 2011/0256734 A1 | 10/2011 | Hausmann et al. |
| 2011/0262642 A1 | 10/2011 | Xiao et al. |
| 2012/0009802 A1 | 1/2012 | Lavoie et al. |
| 2012/0009803 A1 | 1/2012 | Jung et al. |
| 2012/0011889 A1 | 1/2012 | Bogdahn et al. |
| 2012/0028469 A1 | 2/2012 | Onizawa et al. |
| 2012/0058282 A1 | 3/2012 | Hong et al. |
| 2012/0068347 A1 | 3/2012 | Isobayashi et al. |
| 2012/0088369 A1 | 4/2012 | Weidman et al. |
| 2012/0104347 A1 | 5/2012 | Quick |
| 2012/0108079 A1 | 5/2012 | Mahajani |
| 2012/0115074 A1 | 5/2012 | Zhang et al. |
| 2012/0142194 A1 | 6/2012 | Hwang |
| 2012/0156882 A1 | 6/2012 | Lee et al. |
| 2012/0156888 A1 | 6/2012 | Sato et al. |
| 2012/0164846 A1 | 6/2012 | Ha et al. |
| 2012/0171846 A1 | 7/2012 | Hwang |
| 2012/0177841 A1 | 7/2012 | Thompson |
| 2012/0213940 A1 | 8/2012 | Mallick |
| 2012/0244711 A1 | 9/2012 | Yin et al. |
| 2012/0264305 A1 | 10/2012 | Nakano |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0065404 A1 | 3/2013 | Weidman et al. |
| 2013/0071580 A1 | 3/2013 | Weidman et al. |

(56) References Cited

U.S. PATENT DOCUMENTS

| | | |
|---|---|---|
| 2013/0084688 A1 | 4/2013 | O'Meara et al. |
| 2013/0113073 A1 | 5/2013 | Liu et al. |
| 2013/0115783 A1 | 5/2013 | Kim et al. |
| 2013/0129940 A1 | 5/2013 | Xiao et al. |
| 2013/0189845 A1 | 7/2013 | Kim et al. |
| 2013/0189854 A1 | 7/2013 | Hausmann et al. |
| 2013/0196082 A1 | 8/2013 | Spence et al. |
| 2013/0200384 A1 | 8/2013 | Mieno |
| 2013/0210236 A1 | 8/2013 | Ogihara et al. |
| 2013/0252437 A1 | 9/2013 | Sano et al. |
| 2013/0273704 A1 | 10/2013 | Jee et al. |
| 2013/0280919 A1 | 10/2013 | Yuasa et al. |
| 2013/0302980 A1 | 11/2013 | Chandrashekar et al. |
| 2013/0327636 A1 | 12/2013 | Majetich et al. |
| 2013/0344248 A1 | 12/2013 | Clark |
| 2014/0023794 A1 | 1/2014 | Mahajani et al. |
| 2014/0099797 A1 | 4/2014 | Terasaki |
| 2014/0113455 A1 | 4/2014 | Reimer et al. |
| 2014/0113457 A1 | 4/2014 | Sims et al. |
| 2014/0120737 A1 | 5/2014 | Swaminathan et al. |
| 2014/0134812 A1 | 5/2014 | Kim et al. |
| 2014/0141625 A1 | 5/2014 | Fukazawa et al. |
| 2014/0141626 A1 | 5/2014 | Hausmann et al. |
| 2014/0158580 A1 | 6/2014 | Xiao et al. |
| 2014/0170853 A1 | 6/2014 | Shamma et al. |
| 2014/0193983 A1 | 7/2014 | LaVoie |
| 2014/0216337 A1 | 8/2014 | Swaminathan et al. |
| 2014/0262038 A1 | 9/2014 | Wang et al. |
| 2014/0273477 A1 | 9/2014 | Niskanen et al. |
| 2014/0273528 A1 | 9/2014 | Niskanen et al. |
| 2014/0273529 A1 | 9/2014 | Nguyen et al. |
| 2014/0273530 A1 | 9/2014 | Nguyen et al. |
| 2014/0273531 A1 | 9/2014 | Niskanen et al. |
| 2014/0302686 A1 | 10/2014 | Pan et al. |
| 2015/0004805 A1 | 1/2015 | Omstead et al. |
| 2015/0017812 A1 | 1/2015 | Chandrasekharan et al. |
| 2015/0021712 A1 | 1/2015 | Zschaetzsch et al. |
| 2015/0031218 A1 | 1/2015 | Karakawa |
| 2015/0056540 A1 | 2/2015 | Fukuda |
| 2015/0126042 A1 | 5/2015 | Pasquale et al. |
| 2015/0132965 A1 | 5/2015 | Devilliers et al. |
| 2015/0137061 A1 | 5/2015 | Donghi et al. |
| 2015/0155198 A1 | 6/2015 | Tsai et al. |
| 2015/0162416 A1 | 6/2015 | Chang et al. |
| 2015/0167163 A1 | 6/2015 | Kubota et al. |
| 2015/0200110 A1 | 7/2015 | Li et al. |
| 2015/0217330 A1* | 8/2015 | Haukka ............ C23C 18/1208 |
| 2015/0243708 A1 | 8/2015 | Ravasio et al. |
| 2015/0249153 A1 | 9/2015 | Morin et al. |
| 2015/0251917 A1 | 9/2015 | Hong et al. |
| 2015/0259791 A1 | 9/2015 | Hausmann et al. |
| 2015/0315704 A1 | 11/2015 | Nakano et al. |
| 2016/0020092 A1 | 1/2016 | Kang et al. |
| 2016/0042950 A1 | 2/2016 | Dai et al. |
| 2016/0046501 A1 | 2/2016 | Kverel et al. |
| 2016/0049307 A1 | 2/2016 | Chen |
| 2016/0064224 A1 | 3/2016 | Hung et al. |
| 2016/0079054 A1 | 3/2016 | Chen et al. |
| 2016/0093484 A1 | 3/2016 | Marsh |
| 2016/0099143 A1 | 4/2016 | Yan et al. |
| 2016/0109804 A1 | 4/2016 | Huli |
| 2016/0111297 A1 | 4/2016 | Chen et al. |
| 2016/0148799 A1 | 5/2016 | Wang et al. |
| 2016/0148800 A1 | 5/2016 | Henri et al. |
| 2016/0148806 A1 | 5/2016 | Henri et al. |
| 2016/0155739 A1 | 6/2016 | Ting et al. |
| 2016/0163557 A1* | 6/2016 | Hudson ............ H01J 37/32715 |
| | | 156/345.24 |
| 2016/0172194 A1 | 6/2016 | Kunnen et al. |
| 2016/0190008 A1 | 6/2016 | Chandrashekar et al. |
| 2016/0225640 A1 | 8/2016 | Raley et al. |
| 2016/0247678 A1 | 8/2016 | Feng et al. |
| 2016/0247680 A1 | 8/2016 | O'Meara et al. |
| 2016/0254171 A1 | 9/2016 | Shamma et al. |
| 2016/0284539 A1 | 9/2016 | Horita et al. |
| 2016/0284567 A1 | 9/2016 | Reilly et al. |
| 2016/0293398 A1 | 10/2016 | Danek et al. |
| 2016/0293418 A1 | 10/2016 | Pasquale et al. |
| 2016/0300718 A1 | 10/2016 | Raley et al. |
| 2016/0329238 A1 | 11/2016 | Tang et al. |
| 2016/0336178 A1 | 11/2016 | Swaminathan et al. |
| 2016/0336187 A1 | 11/2016 | Liou et al. |
| 2016/0343580 A1 | 11/2016 | Hudson |
| 2016/0365425 A1 | 12/2016 | Chen et al. |
| 2016/0372334 A1 | 12/2016 | Mignot et al. |
| 2017/0069510 A1 | 3/2017 | Kal et al. |
| 2017/0092496 A1 | 3/2017 | Devilliers |
| 2017/0092857 A1 | 3/2017 | Hausmann |
| 2017/0110550 A1 | 4/2017 | Tsai et al. |
| 2017/0114459 A1 | 4/2017 | Saly et al. |
| 2017/0117134 A1 | 4/2017 | Henri et al. |
| 2017/0148637 A1 | 5/2017 | Devilliers |
| 2017/0170015 A1 | 6/2017 | Kim et al. |
| 2017/0170026 A1 | 6/2017 | Hudson et al. |
| 2017/0207082 A1 | 7/2017 | Wang et al. |
| 2017/0323785 A1 | 11/2017 | Singhal et al. |
| 2017/0323803 A1 | 11/2017 | Van Schravendijk et al. |
| 2017/0358450 A1 | 12/2017 | Ko et al. |
| 2018/0005814 A1 | 1/2018 | Kumar et al. |
| 2018/0033622 A1 | 2/2018 | Swaminathan et al. |
| 2018/0061628 A1 | 3/2018 | Ou et al. |
| 2018/0061650 A1 | 3/2018 | Mahorowala et al. |
| 2018/0076023 A1 | 3/2018 | Yan et al. |
| 2018/0102245 A1 | 4/2018 | Sims et al. |
| 2018/0114903 A1 | 4/2018 | Hausmann |
| 2018/0138028 A1 | 5/2018 | Henri et al. |
| 2018/0138036 A1 | 5/2018 | Baldasseroni et al. |
| 2018/0138040 A1 | 5/2018 | LaVoie |
| 2018/0138405 A1 | 5/2018 | McKerrow et al. |
| 2018/0223429 A1 | 8/2018 | Fukazawa et al. |
| 2018/0265973 A1 | 9/2018 | Firouzdor et al. |
| 2018/0294166 A1 | 10/2018 | Mallick et al. |
| 2018/0308695 A1 | 10/2018 | LaVoie et al. |
| 2018/0347035 A1 | 12/2018 | Weimer et al. |
| 2019/0027362 A1 | 1/2019 | Cheng et al. |
| 2019/0041756 A1 | 2/2019 | Hasebe et al. |
| 2019/0055645 A1 | 2/2019 | Li et al. |
| 2019/0080903 A1 | 3/2019 | Abel et al. |
| 2019/0172723 A1 | 6/2019 | Cheng et al. |
| 2019/0206677 A1 | 7/2019 | Abel et al. |
| 2019/0279866 A1 | 9/2019 | Pore |
| 2019/0284694 A1 | 9/2019 | Knisley et al. |
| 2019/0333753 A1* | 10/2019 | Ueda ................ H01L 21/02315 |
| 2019/0345608 A1 | 11/2019 | Agarwal et al. |
| 2020/0032389 A1 | 1/2020 | Lei et al. |
| 2020/0105509 A1* | 4/2020 | Drewery ........... H01L 21/31116 |
| 2020/0190664 A1 | 6/2020 | Hu et al. |
| 2020/0227314 A1* | 7/2020 | Kim .................. H01L 23/53295 |
| 2020/0381623 A1 | 12/2020 | Qi et al. |
| 2021/0082685 A1 | 3/2021 | Kataoka et al. |
| 2021/0104399 A1 | 4/2021 | Kuroda et al. |
| 2021/0125832 A1 | 4/2021 | Bhatnagar |
| 2021/0301400 A1 | 9/2021 | Lee et al. |
| 2021/0313167 A1 | 10/2021 | Pore et al. |
| 2021/0384029 A1 | 12/2021 | Fields et al. |
| 2022/0037144 A1 | 2/2022 | Rao et al. |
| 2022/0275510 A1 | 9/2022 | Gupta et al. |
| 2023/0220544 A1 | 7/2023 | Gupta et al. |
| 2023/0245896 A1 | 8/2023 | Gupta et al. |
| 2023/0317449 A1 | 10/2023 | Gupta et al. |
| 2024/0087883 A1 | 3/2024 | Matsuki et al. |
| 2024/0355624 A1 | 10/2024 | Yang et al. |
| 2024/0410053 A1 | 12/2024 | Gupta et al. |
| 2025/0014890 A1 | 1/2025 | Gupta et al. |
| 2025/0014893 A1 | 1/2025 | Agnew et al. |
| 2025/0019827 A1 | 1/2025 | Yeon et al. |
| 2025/0054751 A1 | 2/2025 | Gupta et al. |
| 2025/0069882 A1 | 2/2025 | Gupta et al. |
| 2025/0197996 A1 | 6/2025 | Gupta et al. |

FOREIGN PATENT DOCUMENTS

| | | |
|---|---|---|
| CN | 1841676 A | 10/2006 |
| CN | 101006195 A | 7/2007 |

(56) References Cited

FOREIGN PATENT DOCUMENTS

| | | | |
|---|---|---|---|
| CN | 101255548 A | 9/2008 |
| CN | 101328578 A | 12/2008 |
| CN | 101378007 A | 3/2009 |
| CN | 101506955 A | 8/2009 |
| CN | 101981225 A | 2/2011 |
| CN | 102224573 A | 10/2011 |
| CN | 102471885 A | 5/2012 |
| CN | 102479672 A | 5/2012 |
| CN | 102906305 A | 1/2013 |
| CN | 103168344 A | 6/2013 |
| CN | 103225071 A | 7/2013 |
| CN | 103403847 A | 11/2013 |
| CN | 103515197 A | 1/2014 |
| CN | 103632955 A | 3/2014 |
| CN | 103635605 A | 3/2014 |
| CN | 103918068 A | 7/2014 |
| CN | 104046955 A | 9/2014 |
| CN | 104272441 A | 1/2015 |
| CN | 104517892 A | 4/2015 |
| CN | 104576506 A | 4/2015 |
| CN | 104752199 A | 7/2015 |
| CN | 105448701 A | 3/2016 |
| CN | 205164805 U | 4/2016 |
| CN | 105609471 A | 5/2016 |
| CN | 105789027 A | 7/2016 |
| CN | 105917445 A | 8/2016 |
| CN | 105977141 A | 9/2016 |
| CN | 106057637 A | 10/2016 |
| CN | 106449360 A | 2/2017 |
| CN | 108411281 A | 8/2018 |
| CN | 109791875 A | 5/2019 |
| EP | 0277766 A2 | 8/1988 |
| EP | 2278046 A1 | 1/2011 |
| GB | 1181559 A | 2/1970 |
| JP | 2005011904 A | 1/2005 |
| JP | 2005136300 A | 5/2005 |
| JP | 2005163084 A | 6/2005 |
| JP | 2005210076 A | 8/2005 |
| JP | 2006060091 A | 3/2006 |
| JP | 2006080359 A | 3/2006 |
| JP | 2007154297 A | 6/2007 |
| JP | 2007281181 A | 10/2007 |
| JP | 2008517479 A | 5/2008 |
| JP | 2008160123 A | 7/2008 |
| JP | 2008306093 A | 12/2008 |
| JP | 2009010318 A | 1/2009 |
| JP | 2009170823 A | 7/2009 |
| JP | 2010010497 A | 1/2010 |
| JP | 2010087187 A | 4/2010 |
| JP | 2010527138 A | 8/2010 |
| JP | 2010232214 A | 10/2010 |
| JP | 2010239103 A | 10/2010 |
| JP | 2010283388 A | 12/2010 |
| JP | 2011035366 A | 2/2011 |
| JP | 2011192776 A | 9/2011 |
| JP | 2012084707 A | 4/2012 |
| JP | 2012142574 A | 7/2012 |
| JP | 2012169408 A | 9/2012 |
| JP | 2012221978 A | 11/2012 |
| JP | 5225081 B2 | 7/2013 |
| JP | 2013153164 A | 8/2013 |
| JP | 2013182951 A | 9/2013 |
| JP | 2013225655 A | 10/2013 |
| JP | 2014038968 A | 2/2014 |
| JP | 2014179607 A | 9/2014 |
| JP | 2014532304 A | 12/2014 |
| JP | 2015029097 A | 2/2015 |
| JP | 2015512568 A | 4/2015 |
| JP | 2015159335 A | 9/2015 |
| JP | 2016184685 A | 10/2016 |
| JP | 2017130665 A | 7/2017 |
| KR | 20010075177 A | 8/2001 |
| KR | 20060023137 A | 3/2006 |
| KR | 20070088512 A | 8/2007 |
| KR | 100861851 B1 | 10/2008 |
| KR | 20090033449 A | 4/2009 |
| KR | 20090080019 A | 7/2009 |
| KR | 20090119661 A | 11/2009 |
| KR | 20090131821 A | 12/2009 |
| KR | 20100027062 A | 3/2010 |
| KR | 20100128863 A | 12/2010 |
| KR | 20120098448 A | 9/2012 |
| KR | 20130049690 A | 5/2013 |
| KR | 20130062256 A | 6/2013 |
| KR | 20130135087 A | 12/2013 |
| KR | 20140069326 A | 6/2014 |
| KR | 20140079431 A | 6/2014 |
| KR | 20140126241 A | 10/2014 |
| KR | 20140141686 A | 12/2014 |
| KR | 20150025224 A | 3/2015 |
| KR | 20150053253 A | 5/2015 |
| KR | 20150103642 A | 9/2015 |
| KR | 20160033057 A | 3/2016 |
| KR | 20160045527 A | 4/2016 |
| KR | 20160068002 A | 6/2016 |
| KR | 101884555 B1 | 8/2018 |
| KR | 20200086582 A | 7/2020 |
| KR | 20210014483 A | 2/2021 |
| KR | 102407031 B1 | 6/2022 |
| TW | 483103 B | 4/2002 |
| TW | 200733215 A | 9/2007 |
| TW | 201033739 A | 9/2010 |
| TW | 201430951 A | 8/2014 |
| TW | 201439105 A | 10/2014 |
| TW | 201606855 A | 2/2016 |
| TW | 201623682 A | 7/2016 |
| TW | 201736633 A | 10/2017 |
| TW | 201835374 A | 10/2018 |
| TW | 202014546 A | 4/2020 |
| WO | WO-2006018441 A1 | 2/2006 |
| WO | WO-2006026350 A2 | 3/2006 |
| WO | WO-2011130397 A2 | 10/2011 |
| WO | WO-2012061593 A2 | 5/2012 |
| WO | WO-2012066977 A1 | 5/2012 |
| WO | WO-2012165166 A1 | 12/2012 |
| WO | WO-2013043330 A1 | 3/2013 |
| WO | WO-2013066667 A1 | 5/2013 |
| WO | WO-2013137115 A1 | 9/2013 |
| WO | WO-2013148880 A1 | 10/2013 |
| WO | WO-2014030393 A1 | 2/2014 |
| WO | WO-2020131635 A1 | 6/2020 |
| WO | WO-2021025874 A1 * | 2/2021 ........... C23C 16/045 |

OTHER PUBLICATIONS

Becker, F.S. and Rohl, S. (Nov. 1987) "Low Pressure Deposition of Doped SiO2 by Pyrolysis of Tetraethylorthosilicate (TEOS)," J. Electrochem. Soc.: Solid-State Science and Technology, 134(11):2923-2931.

Cecchi et al., (2007) "Ultra-thin conformal pore-sealing of low-k materials by plasma-assisted ALD," University of New Mexico, Albuquerque, NM, Sandia National Labs, Albuquerque, NM, 1 page.

Chinese First Office Action dated Apr. 12, 2021 issued in Application No. CN 201711112653.9.

Chinese First Office Action dated Jul. 31, 2020 issued in Application No. CN 201710636255.0.

Chinese First Office Action dated Jun. 23, 2020 issued in Application No. CN 201811075877.1.

Chinese First Office Action dated Mar. 30, 2018 issued in Application No. CN 201610206201.6.

Chinese First Office Action dated May 19, 2016 issued in Application No. CN 201310021460.8.

Chinese First Office Action dated Nov. 13, 2020 issued in Application No. CN 201710772400.8.

Chinese First Office Action dated Nov. 8, 2017 issued in Application No. CN 201510615853.0.

Chinese Fourt Office Action dated May 16, 2018 issued in Application No. CN 201310021460.8.

Chinese Notification of Reexamination dated Apr. 17, 2020 issued in Application No. CN 201310021460.8.

(56) References Cited

OTHER PUBLICATIONS

Chinese Second Office Action dated Apr. 13, 2017 issued in Application No. CN 201310021460.8.
Chinese Second Office Action dated Jan. 24, 2019 issued in Application No. CN 201610206201.6.
Chinese Second Office Action dated Mar. 15, 2021 issued in Application No. CN 201811075877.1.
Chinese Third Office Action dated Oct. 17, 2017 issued in Application No. CN 201310021460.8.
CN Office Action dated Dec. 6, 2023, in CN Application No. 202080055912.2, with English translation.
CN Office Action dated Jun. 17, 2024 in CN Application No. 202110564747.X, with English Translation.
CN Office Action dated Jun. 29, 2023 in Application No. CN201780070122.X with English Translation.
CN Office Action dated Mar. 7, 2022, in Application No. CN201711112653.9 with English translation.
CN Office Action dated Mar. 15, 2023 in Application No. CN201780070122.X with English Translation.
CN Office Action dated Mar. 30, 2023, in Application No. CN201880073124.9 with English translation.
CN Office Action dated Nov. 19, 2021, in application No. CN201711112653 with English translation.
CN Office Action dated Oct. 8, 2022 in Application No. CN201780070122.X with English Translation.
CN Office Action dated Sep. 16, 2022, in Application No. CN201780070305.1 with English translation.
CN Office Action dated Sep. 2, 2021, in application No. CN201811075877.1 with English translation.
CN Office Action dated Sep. 21, 2023, in Application No. CN201880073124.9 with English translation.
European Examination Report dated Dec. 11, 2017 issued in Application No. EP 13 15 2046.
European Extended Search Report dated Apr. 14, 2014 issued in Application No. EP13152046.2.
Huang et al. (2017) "Design of efficient mono-aminosilane precursors for atomic layer deposition of SiO2 thin films," Royal Society of Chemistry Adv. 2017, 7:22672-22678.
International Preliminary Report on Patentability and Written Opinion dated Feb. 2, 2023 in PCT Application No. PCT/US2021/042652.
International Preliminary Report on Patentability and Written Opinion dated Jan. 18, 2024 in PCT Application No. PCT/US2022/036026.
International Preliminary Report on Patentability and Written Opinion dated Jul. 4, 2024 in PCT Application No. PCT/US2022/081972.
International Preliminary Report on Patentability and Written Opinion dated Jun. 13, 2024 in PCT Application No. PCT/US2022/080683.
International Preliminary Report on Patentability and Written Opinion dated Jun. 27, 2024 in PCT Application No. PCT/US2022/081591.
International Preliminary Report on Patentability and Written Opinion dated Mar. 7, 2024 in PCT Application No. PCT/US2022/075296.
International Preliminary Report on Patentability dated Dec. 15, 2022 from PCT/US2021/035269.
International Preliminary Report on Patentability dated Feb. 9, 2023 in PCT Application No. PCT/US2021/0709880.
International Preliminary Report on Patentability dated Feb. 17, 2022 in PCT Application No. PCT/US2020/043459.
International Preliminary Report on Patentability dated Mar. 26, 2020 issued in Application No. PCT/US2018/050049.
International Preliminary Report on Patentability dated May 23, 2019 issued in Application No. PCT/US17/60692.
International Preliminary Report on Patentability dated May 23, 2019 issued in Application No. PCT/US2017/060240.
International Search Report and Written Opinion dated Apr. 14, 2023 in PCT Application No. PCT/US2022/080683.
International Search Report and Written Opinion dated Apr. 25, 2023 in PCT Application No. PCT/US2022/081591.
International Search Report and Written Opinion dated Apr. 28, 2023, in Application No. PCT/US2022/081972.
International Search Report and Written Opinion dated Dec. 2, 2022 in PCT Application No. PCT/US2022/075296.
International Search Report and Written Opinion dated Dec. 26, 2023 in PCT Application No. PCT/US2023/031873.
International Search Report and Written Opinion dated Feb. 13, 2018 issued in Application No. PCT/US2017/060692.
International Search Report and Written Opinion dated Feb. 21, 2018 issued in Application No. PCT/US2017/060240.
International Search Report and Written Opinion dated Feb. 25, 2019 issued in Application No. PCT/US2018/050049.
International Search Report and Written Opinion dated Nov. 11, 2020 issued in Application No. PCT/US2020/043459.
International Search Report and Written Opinion dated Nov. 11, 2021, in PCT Application No. PCT/US2021/042652.
International Search Report and Written Opinion dated Nov. 17, 2021, in PCT Application No. PCT/US2021/070988.
International Search Report and Written Opinion dated Oct. 28, 2022 in PCT Application No. PCT/US2022/036026.
International Search Report and Written Opinion dated Sep. 23, 2021 in PCT Application No. PCT/US2021/035269.
Japanese Decision of Rejection dated Jan. 9, 2018 issued in Application No. JP 2013-007612.
Japanese First Office Action dated Dec. 1, 2020 issued in Application No. JP 2016-185454.
Japanese First Office Action dated May 28, 2019 issued in Application No. JP 2017-143195.
Japanese First Office Action dated May 29, 2019 issued in Application No. JP 2018-090402.
Japanese First Office Action dated Oct. 8, 2019 issued in Application No. JP 2015-184688.
Japanese Notice of Allowance Apr. 28, 2020 issued in Application No. JP 2015-184688.
Japanese Office Action dated Jan. 10, 2017 issued in Application No. JP 2013-007612.
Japanese Reason for Refusal dated Apr. 2, 2019 issued in Application No. JP 2013-007612.
Japanese Second Office Action dated Dec. 24, 2019 issued in Application No. JP 2017-143195.
Japanese Second Office Action [Decision of Rejection] dated Jan. 14, 2020 issued in Application No. JP 2018-090402.
Japanese Third Office Action dated Aug. 25, 2020 issued in Application No. JP 2017-143195.
JP Office Action dated Oct. 18, 2022, in Application No. JP2020-514992 with English translation.
King, Sean W., (Jul./Aug. 2011) "Plasma enhanced atomic layer deposition of SiNx:H and SiO2," J. Vac. Sci. Technol. A29(4):041501-1 through 041501-9 (9 pages).
Korean Decision from the Patent Tribunal of the KIPO (description) dated May 26, 2015 issued in Application No. KR 10-2012-0043797.
Korean Final Office Action dated Aug. 18, 2014 issued in Application No. KR 10-2012-0043797.
Korean First Office Action dated Nov. 27, 2019 issued in Application No. KR 10-2017-0093932.
Korean Notice of Provisional Rejection dated Dec. 6, 2013 issued in Application No. KR 10-2012-0043797.
Korean Second Office Action dated Oct. 27, 2020 issued in Application No. KR 10-2017-0093932.
KR Office Action dated Jul. 5, 2022 in Application No. KR10-2015-0163065 with English translation.
KR office action dated Apr. 24, 2022 in Application No. KR10-2015-0133942 with English Translation.
KR Office action dated Aug. 8, 2022 in KR Application No. KR10-2015-0162556 with English translation.
KR Office Action dated Aug. 17, 2023, in application No. KR10-2016-0039946 with English translation.
KR Office Action dated Aug. 30, 2023, in Application No. KR10-2020-7010492 with English Translation.

(56) References Cited

OTHER PUBLICATIONS

KR Office Action dated Feb. 5, 2024 in KR Application No. 10-2023-0184996, with English Translation.
KR Office action dated Feb. 24, 2023 in KR Application No. KR10-2015-0162556 with English translation.
KR Office Action dated Jan. 5, 2023 in Application No. KR10-2016-0039946 with English translation.
KR Office Action dated Jan. 12, 2022 in Application No. KR1020150163065 with English translation.
KR Office Action dated Jan. 26, 2022, in Application No. 10-2019-7016749 with English translation.
KR Office Action dated Jul. 12, 2022 in Application No. KR20197016749 With English translation.
KR Office Action dated Jul. 14, 2023, in application No. KR10-2022-7018901 with English translation.
KR Office Action dated Jul. 20, 2022, in Application No. KR10-2017-0147904 with English translation.
KR Office Action dated Jun. 7, 2022 in Application No. KR20210086044 with English translation.
KR Office Action dated Jun. 10, 2022, in Application No. KR1020170109223 with English translation.
KR Office Action dated Mar. 4, 2022, in Application No. KR10-2019-7017087 with English Translation.
KR Office Action dated Nov. 4, 2022 in Application No. KR10-2022-7018901 with English translation.
KR Office Action dated Nov. 30, 2021 in Application No. KR10-2019-7017087 with English Translation.
KR Office Action dated Oct. 6, 2022, in Application No. KR10-2015-0133942 with English Translation.
KR Office Action dated Sep. 6, 2022, in Application No. KR10-2017-0109223 with English translation.
KR Office Action dated Sep. 27, 2021, in application No. KR20210086044 with English translation.
KR Office Action dated Sep. 29, 2021, in application No. KR1020170109223 with English translation.
Kunnen, E. et al., "A way to integrate multiple block layers for middle of line contact patterning", in Advanced Etch Technology for Nanopatterning IV, Edited by Qinghuam Lin and Sebastian Engelmann, Mar. 17, 2015, Proc. of SPIE, vol. 9428, 94280W1-8, 8 pages. [Downloaded on Jun. 27, 2017 from http://proceedings.spiedigitallibrary.org ].
Lin et al., (1998) "Silicon Nitride Films Deposited by Atmospheric Pressure Chemical Vapor Deposition," Materials Research Society Symposium Proceedings vol. 495, Chemical Aspects of Electronic Ceramics Processing, Symposium held Nov. 30-Dec. 4, 1997, Boston, Massachusetts, U.S.A., 8 pages.
PCT International Preliminary Report on Patentability and Written Opinion, dated Oct. 26, 2012, issued in PCT/US2011/032303.
PCT International Search Report and Written Opinion, dated Feb. 20, 2012, issued in PCT/US2011/032303.
PCT Invitation to Pay Additional Fees; Communication Re Partial International Search, dated Dec. 16, 2011, issued in Application No. PCT/US2011/032303.
Plasma Enhanced Atomic Layer Deposition (PEALD), Website: http://www.asm.com/index.php?option=com_content&task=view&id=19&Itemid=161 (2010), 1 page.
"PlasmaProTM NGP®80 Range," Oxford Instruments (2010), 8 pages.
SG Written Opinion dated Jan. 17, 2024 in SG Application No. 11202201069Y.
Singapore Notice of Eligibility for Grant and Supplemental Examination Report dated Jan. 20, 2020 issued in Application No. SG 10201507848X.
Taiwan Examination Report dated Mar. 29, 2017 issued in Application No. TW 102102054.
Taiwan First Office Action dated Feb. 27, 2019, issued in Application No. TW 106124691.
Taiwan First Office Action dated Oct. 16, 2019 issued in Application No. TW 105109955.
Taiwanese First Decision of Refusal dated Dec. 22, 2020 issued in Application No. TW 1051305401.
Taiwanese First Office Action dated Apr. 25, 2019 issued in Application No. TW 104131344.
Taiwanese First Office Action dated Jun. 13, 2019 issued in Application No. TW 104138370.
Taiwanese First Office Action dated Mar. 25, 2020 issued in Application No. TW 105130541.
Taiwanese Notice of Allowance dated Feb. 17, 2019 issued in Application No. TW 104138370.
TW Office Action dated Jun. 17, 2022 in Application No. TW107131673 With English Translation.
US Advisory Action dated May 20, 2019 issued in U.S. Appl. No. 15/349,746.
U.S. Appl. No. 16/852,261, inventors Abel et al., filed Apr. 17, 2020.
U.S. Corrected Notice of Allowance dated Jul. 17, 2024 in U.S. Appl. No. 17/632,074.
US Final Office Action dated Apr. 20, 2018 issued in U.S. Appl. No. 15/349,753
US Final Office Action dated Apr. 25, 2013 issued in U.S. Appl. No. 13/084,305.
US Final Office Action dated Apr. 9, 2018 issued in U.S. Appl. No. 15/279,312.
US Final Office Action dated Dec. 21, 2018 issued in U.S. Appl. No. 15/349,746.
US Final Office Action dated Feb. 5, 2020 issued in U.S. Appl. No. 15/349,746.
U.S. Final Office Action dated Jan. 2, 2018 issued in U.S. Appl. No. 15/351,221.
US Final Office Action dated Jan. 18, 2018 issued in U.S. Appl. No. 15/349,746.
US Final Office Action dated Jan. 21, 2020 issued in U.S. Appl. No. 15/847,744.
U.S. Final Office Action dated Mar. 29, 2024 in U.S. Appl. No. 17/632,074.
US Final Office Action dated Nov. 14, 2014 issued in U.S. Appl. No. 14/065,334.
US Final Office Action dated Oct. 19, 2017 issued in U.S. Appl. No. 15/279,314.
U.S. Non-Final Office Action dated Jul. 5, 2017 issued in U.S. Appl. No. 15/351,221.
U.S. Non-Final Office Action dated Jul. 7, 2023, in U.S. Appl. No. 17/632,074.
US Notice of Allowance dated Apr. 25, 2018 issued in U.S. Appl. No. 15/253,546.
US Notice of Allowance dated Aug. 18, 2015 issued in U.S. Appl. No. 14/494,914.
US Notice of Allowance dated Dec. 11, 2019 issued in U.S. Appl. No. 15/279,312.
US Notice of Allowance dated Dec. 5, 2018 issued in U.S. Appl. No. 15/703,917.
US Notice of Allowance dated Feb. 1, 2016 issued in U.S. Appl. No. 14/552,245.
US Notice of Allowance dated Feb. 17, 2015 issued in U.S. Appl. No. 14/065,334.
US Notice of Allowance dated Feb. 8, 2017 issued in U.S. Appl. No. 14/713,639.
US Notice of Allowance dated Jan. 15, 2020 issued in U.S. Appl. No. 16/294,783.
U.S. Notice of Allowance dated Jul. 5, 2024 in U.S. Appl. No. 17/632,074.
US Notice of Allowance dated Jul. 1, 2020 issued in U.S. Appl. No. 15/349,746.
US Notice of Allowance dated Jul. 15, 2016 issued in U.S. Appl. No. 14/678,736.
U.S. Notice of Allowance dated Jul. 16, 2018 issued in U.S. Appl. No. 15/351,221.
US Notice of Allowance dated Jul. 26, 2013, issued U.S. Appl. No. 13/414,619.
US Notice of Allowance dated Jul. 26, 2018 issued in U.S. Appl. No. 15/829,702.
US Notice of Allowance dated Jun. 17, 2019 issued in U.S. Appl. No. 15/349,753.

(56) References Cited

OTHER PUBLICATIONS

US Notice of Allowance dated May 28, 2020 issued in U.S. Appl. No. 15/847,744.
US Notice of Allowance dated Oct. 26, 2016 issued in U.S. Appl. No. 14/552,245.
US Notice of Allowance dated Sep. 1, 2017 issued in U.S. Appl. No. 15/272,222.
US Notice of Allowance dated Sep. 19, 2016 issued in U.S. Appl. No. 14/935,317.
US Notice of Allowance dated Sep. 26, 2016 issued in U.S. Appl. No. 14/552,011.
US Notice of Allowance dated Sep. 28, 2017 issued in U.S. Appl. No. 15/399,637.
US Office Action dated Apr. 11, 2014 issued in U.S. Appl. No. 14/065,334.
US Office Action dated Apr. 18, 2016 issued in U.S. Appl. No. 14/935,317.
US Office Action dated Apr. 18, 2019 issued in U.S. Appl. No. 15/279,312.
US Office Action dated Apr. 7, 2017 issued in U.S. Appl. No. 15/279,314.
US Office Action dated Jul. 14, 2017 issued in U.S. Appl. No. 15/349,746.
US Office Action dated Jul. 18, 2018 issued in U.S. Appl. No. 15/703,917.
US Office Action dated Jul. 30, 2019 issued in U.S. Appl. No. 15/847,744.
US Office Action dated Jun. 14, 2019 issued in U.S. Appl. No. 15/349,746.
US Office Action dated Jun. 29, 2017 issued in U.S. Appl. No. 15/279,312.
US Office Action dated Jun. 29, 2018 issued in U.S. Appl. No. 15/349,746.
US Office Action dated Jun. 7, 2013 issued U.S. Appl. No. 13/414,619.
US Office Action dated May 19, 2017 issued in U.S. Appl. No. 15/272,222.
US Office Action dated May 24, 2016 issued in U.S. Appl. No. 14/552,245.
US Office Action dated May 25, 2016 issued in U.S. Appl. No. 14/552,011.
US Office Action dated Oct. 1, 2015 issued in U.S. Appl. No. 14/552,245.
US Office Action dated Oct. 23, 2017 issued in U.S. Appl. No. 15/349,753.
US Office Action dated Oct. 6, 2017 issued in U.S. Appl. No. 15/253,546.
US Office Action dated Sep. 14, 2012 issued in U.S. Appl. No. 13/084,305.
US Office Action dated Sep. 28, 2018 issued in U.S. Appl. No. 15/349,753.
U.S. Appl. No. 18/684,591, inventors Yang N, etal., filed Feb. 16, 2024.
U.S. Appl. No. 18/720,146, inventors Austin D.Z, et al., filed Jun. 14, 2024.
U.S. Restriction requirement dated Apr. 20, 2023 in U.S. Appl. No. 17/632,074.
Wikipedia, The Free Encyclopedia, Definition of "Silicon Nitride," Archived from Apr. 9, 2015, 1 page [Downloaded on Oct. 12, 2017 from https://web.archive.org/web/20150409055521/https://en.wikipedia.org/wiki/Silicon_nitride].
Cheng Y., et al., "Plasma Damage on Low-k Dielectric Materials," Chapter 15, Plasma Science and Technology, Intechopen, 2018, pp. 291-317.
CN Office Action dated Jan. 7, 2025 in CN Application No. 202080055912.2 with English translation.
CN Office Action dated Sep. 11, 2024 in CN Application No. 202080055912.2 with English translation.
EP Extended European Search Report dated Jun. 6, 2025 in EP Application No. 22838286.7.
International Preliminary Report on Patentability and Written Opinion dated Jul. 18, 2024 in PCT Application No. PCT/US2022/082624.
International Preliminary Report on Patentability and Written Opinion dated Jun. 27, 2024 in PCT Application No. PCT/US2022/053014.
International Preliminary Report on Patentability and Written Opinion dated Mar. 20, 2025 in PCT Application No. PCT/US2023/031873.
International Preliminary Report on Patentability and Written Opinion dated May 10, 2024 in PCT Application No. PCT/US2022/048098.
International Preliminary Report on Patentability and Written Opinion dated Oct. 3, 2024 in PCT Application No. PCT/US2023/064491.
International Preliminary Reporton Patentability and Written Opinion dated Dec. 5, 2024 in PCT Application No. PCT/US2023/023418.
International Search Report and Written Opinion dated Apr. 21, 2023, in PCT Application No. PCT/US2022/053014.
International Search Report and Written Opinion dated Jul. 12, 2023 in PCT Application No. PCT/US2023/064491.
International Search Report and Written Opinion dated Mar. 2, 2023 in PCT Application No. PCT/US2022/048098.
International Search Report and Written Opinion dated May 8, 2023 in PCT Application No. PCT/US2022/082624.
International Search Report and Written Opinion dated Sep. 15, 2023 in PCT Application No. PCT/US2023/023418.
JP Office Action dated Feb. 4, 2025 in JP Application No. 2022-574509, with English Translation.
KR Decision to Grant and Search Report dated Mar. 27, 2025 in KR Application No. 10-2020-7010492, with English translation.
KR Notice of Allowances dated Oct. 17, 2024 in KR Application No. 10-2023-0184996 with English Translation.
KR Office Action dated Sep. 27, 2024 in KR Application No. 10-2020-7010492 with English Translation.
SG Written Opinion dated Dec. 19, 2024 in SG Application No. 11202201069Y.
TW Office Action and Search Report dated Apr. 2, 2025 in TW Application No. 110126961, with English Translation.
TW Office Action and Search Report dated Apr. 30, 2025 in TW Application No. 110127484, with English Translation.
TW Office Action and Search Report dated Dec. 31, 2024 in TW Application No. 110119959, with English Translation.
US Non-Final Office Action dated Jun. 4, 2025 in U.S. Appl. No. 18/003,098.
US Non-Final Office Action dated Jun. 17, 2025 in U.S. Appl. No. 18/000,562.
U.S. Notice of Allowance dated May 7, 2025 in U.S. Appl. No. 18/003,133.
U.S. Appl. No. 18/868,708, inventors Gupta A et al., filed Nov. 22, 2024.
U.S. Appl. No. 19/109,493, inventors Yang N et al., filed Mar. 6, 2025.
U.S. Restriction Requirement dated Apr. 3, 2025 in U.S. Appl. No. 18/000,562.

\* cited by examiner

PLASMA ENHANCED ATOMIC LAYER DEPOSITION OF SILICON-CONTAINING FILMS

INCORPORATION BY REFERENCE

A PCT Request Form is filed concurrently with this specification as part of the present application. Each application that the present application claims benefit of or priority to as identified in the concurrently filed PCT Request Form is incorporated by reference herein its entirety for all purpose.

BACKGROUND

Many semiconductor device fabrication processes involve formation of films including silicon-containing films such as silicon nitride and silicon oxide. Plasma enhanced atomic layer deposition (ALD) may be used to deposit silicon-containing films.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

One aspect of the disclosure relates to a method including:
providing a substrate in a processing station including a substrate support and a showerhead, the substrate including a gap to be filled; and
depositing silicon-containing film in the gap by a plasma-enhanced atomic layer deposition (PEALD) process including multiple cycles of operations (a)-(d):
  (a) a dose operation including flowing a silicon-containing precursor into the processing station via the showerhead to allow the silicon-containing precursor to adsorb onto the substrate;
  (b) after (a), flowing a purge gas into the processing station;
  (c) after (b), exposing the substrate to plasma species to react with the adsorbed silicon-containing precursor; and
  (d) after (c), flowing a purge gas into the processing station,
    wherein the silicon-containing precursor continues to flow into the processing station during at least (b).

In some embodiments, the silicon-containing precursor continues to flow into the processing station during at least part of (c). In some embodiments, the silicon-containing precursor continues to flow into the processing station during (c) and at least part of (d). In some embodiments, after (a), the silicon-containing precursor flow continues into flow into the processing station at a decreasing flow rate.

In some embodiments, (a) includes flowing an inert gas and a vaporized silicon-containing precursor from a silicon-containing precursor source fluidically connected to a gas delivery line via an outlet valve, the gas delivery line fluidically connected to the showerhead, and at the end of (a), closing the outlet valve. In some such embodiments, silicon-containing precursor in the gas delivery line continues to flow into the processing station after the outlet valve is closed.

In some embodiments, the method further includes diverting silicon-containing precursor from the processing station during one or more of (c) and (d).

In some embodiments, the plasma in (c) is a dual frequency RF plasma generated using high frequency (HF) and low frequency (LF) RF power. In some such embodiments, the HF power is at least 4 kW and the LF power is between 500 W and 5 kW.

In some embodiments, the method further includes increasing an inert gas flow into the processing station during (c). In some embodiments, the method further includes sputtering and re-depositing silicon-containing film in the gap during deposition of the silicon-containing film in the gap.

In some embodiments, the plasma species are generated from oxygen ($O_2$). In some embodiments, the plasma species are generated from nitrous oxide ($N_2O$). In some embodiments, the plasma species are generated from nitrogen ($N_2$). In some embodiments, (b) is between 50-500 milliseconds in duration. In some embodiments, the gap to be filled is a gap between memory stacks of a 3D NAND structure. In some embodiments, the gap has aspect ratio of at least 20:1.

In some embodiments, the method further includes exposing the deposited film to an inhibition plasma before at least one of the multiple cycles. Another aspect of the disclosure relates to a comprising:
providing a substrate in a processing station comprising a substrate support and a showerhead, the substrate comprising a gap to be filled; and
depositing silicon-containing film in the gap by a plasma-enhanced atomic layer deposition (PEALD) process comprising multiple cycles of operations (a)-(d):
  (a) a dose operation comprising flowing a silicon-containing precursor into the processing station via the showerhead to allow the silicon-containing precursor to adsorb onto the substrate;
  (b) after (a), flowing a purge gas into the processing station;
  (c) after (b), exposing the substrate to plasma species generated from a reactant gas to react with the adsorbed silicon-containing precursor; and
  (d) after (c), flowing a purge gas into the processing station,
    wherein the reactant gas and/or the plasma species continue to flow into the processing station during at least (a).

Another aspect of the disclosure relates to a method including: providing a substrate having a structure including a gap to be filled; depositing a silicon-containing protective film selectively at an upper portion of the structure such that it extends only partially into the gap by a plasma-enhanced atomic layer deposition (PEALD) process including:
  (a) a dose operation including flowing a silicon-containing precursor into the processing station via the showerhead to allow the silicon-containing precursor to adsorb onto the substrate;
  (b) after (a), flowing a purge gas into the processing station;
  (c) after (b), exposing the substrate to plasma species to react with the adsorbed silicon-containing precursor, wherein the plasma in (c) is a dual frequency RF plasma generated using high frequency (HF) and low frequency (LF) RF power; and
  (d) after (c), flowing a purge gas into the processing station.

In some embodiments, the method further includes performing one or more cycles of:
- exposing the substrate including the protective film to an inhibition plasma including halogen species to inhibit deposition on a portion of the gap; and
- after exposing the substrate to the inhibition, depositing dielectric material in the gap.

In some embodiments, the silicon-containing precursor continues to flow into the processing station during at least (b). In some embodiments, the protective film is etched during exposure to the inhibition plasma. In some embodiments, the plasma during (a) is generated from nitrogen trifluoride ($NF_3$) and the protective liner is a silicon nitride film.

In some embodiments, the protective liner is between 10 and 999 Angstroms thick. In some embodiments, depositing a protective liner and the performing one or more cycles are performed in the same chamber.

In some embodiments, the structure is a 3D NAND structure, the gap is formed by two stacks each including multiple pairs of an oxide layer and a nitride layer and capped by a polysilicon layer and wherein the protective film protects the polysilicon layer.

Another aspect of the disclosure relates to method including:
- providing a substrate in a processing station including a substrate support and a showerhead;
- depositing a silicon-containing film on the substrate by a plasma-enhanced atomic layer deposition (PEALD) process including multiple cycles of operations (a)-(d):
  - (a) a dose operation including flowing a silicon-containing precursor into the processing station via the showerhead to allow the silicon-containing precursor to adsorb onto the substrate;
  - (b) after (b), flowing a purge gas into the processing station;
  - (c) after (b), exposing the substrate to plasma species to react with the adsorbed silicon-containing precursor; and
  - (d) after (c), flowing a purge gas into the processing station,
  - wherein the silicon-containing precursor continues to flow into the processing station during at least (b).

In some embodiments, the silicon-containing film fills a gap on the substrate. In some embodiments, the silicon-containing film is non-conformally deposited on a structure having two stacks separated by a gap such that the film is deposited at the top of the stacks extending only partially into gap. In some embodiments, the plasma in (c) is a dual frequency RF plasma generated using high frequency (HF) and low frequency (LF) RF power.

Another aspect of the disclosure relates to a method including:
- providing a substrate in a processing station including a substrate support and a showerhead;
- depositing a silicon-containing film on the substrate by a plasma-enhanced atomic layer deposition (PEALD) process including multiple cycles of operations (a)-(d):
  - (a) a dose operation including flowing a silicon-containing precursor into the processing station via the showerhead to allow the silicon-containing precursor to adsorb onto the substrate;
  - (b) after (b), flowing a purge gas into the processing station;
  - (c) after (b), exposing the substrate to plasma species to react with the adsorbed silicon-containing precursor; and
  - (d) after (c), flowing a purge gas into the processing station,
  - wherein the plasma in (c) is a dual frequency RF plasma generated using high frequency (HF) and low frequency (LF) RF power In some embodiments, the silicon-containing film fills a gap on the substrate. In some embodiments, the silicon-containing film is non-conformally deposited on a structure having two stacks separated by a gap such that the film is deposited at the top of the stacks extending only partially into gap.

Yet, another aspect of the disclosure relates to providing a substrate in a processing station; depositing a silicon oxynitride (SiON) film on the substrate by:
- (a) stabilizing process conditions in the processing station for silicon oxide deposition;
- (b) performing x plasma-enhanced atomic layer deposition (PEALD) cycles using an oxygen-based plasma, where x is an integer greater than zero;
- (c) stabilizing process conditions in the processing station for silicon nitride deposition;
- (d) performing y plasma-enhanced atomic layer deposition (PEALD) cycles using a nitrogen-based plasma, where y is an integer greater than zero; and
- (e) repeating (a)-(d) one or more times.

In some embodiments, x+y is no more than 20, 15, or 10.

In some embodiments, the oxygen-based plasma of each cycle of (b) has a first duration and the nitrogen-based plasma of each cycle of (d) has a second duration wherein the second duration is at least twice as long as the first duration. In some embodiments, the SiON film is conformally deposited on a patterned layer.

These and other aspects are described further below with reference to the drawings.

DETAILED DESCRIPTION

Figure 1:
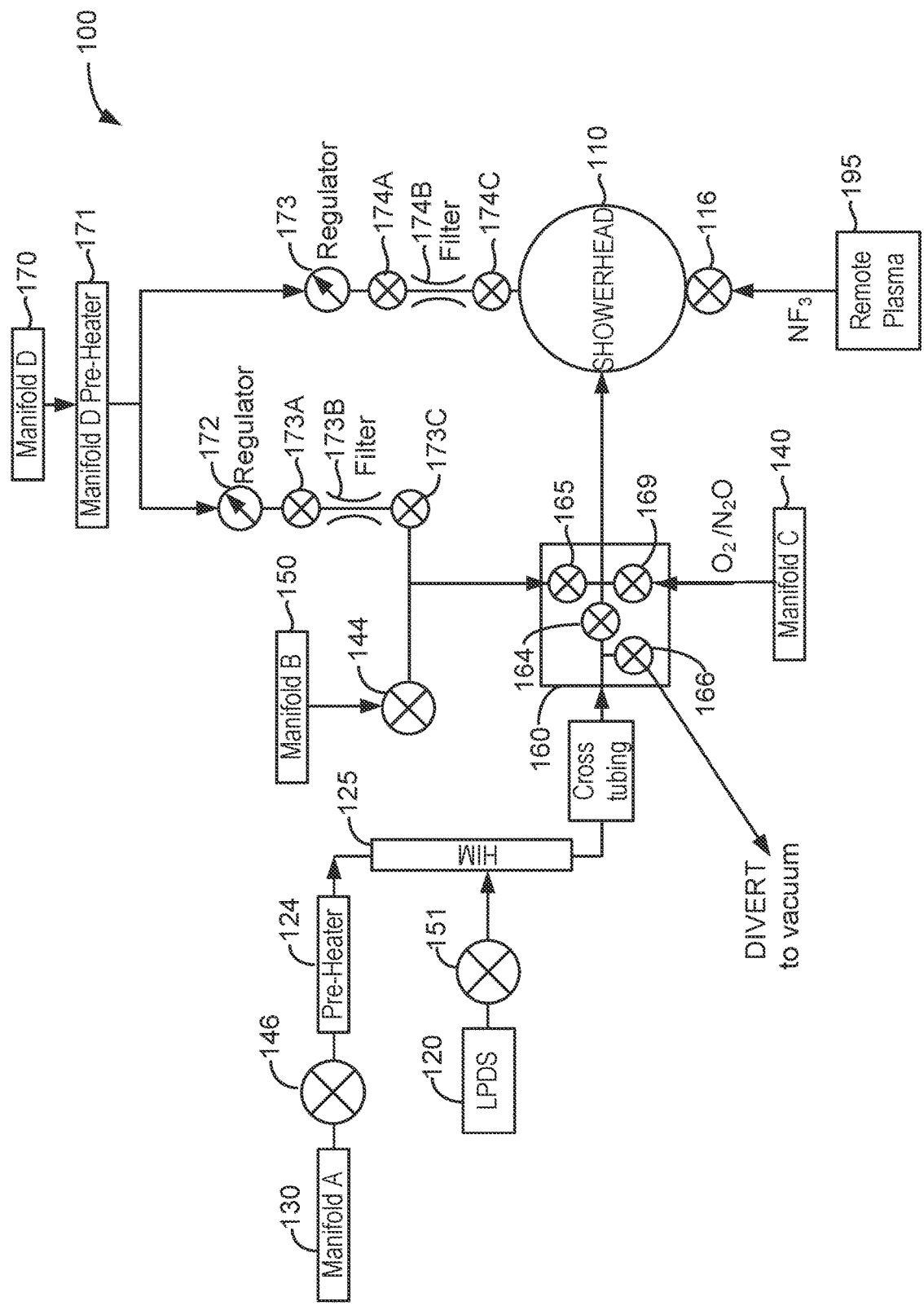
FIG. 1 is a schematic of a gas delivery system for delivering reactants to a single station of a multi-station reaction chamber (not shown) which may be used to perform one or more ALD cycles.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor manufacturing processes often involve deposition of dielectric materials including silicon-containing films. Such film may be used for gap fill in structures including 3D NAND structures, DRAM structures, and shallow trench isolation (STI) structures or onto patterned substrates to form conformal films for various applications, such as barrier layers for contacts. Silicon nitride and silicon carbide layers may be used as encapsulation films, spacers, and barrier films in advanced devices for logic and memory structures, such as FinFETs, MRAM, 3DXPoint, ReRAM, and PCRAM.

Embodiments described herein involve deposition by ALD. ALD is a technique that deposits thin layers of material using sequential self-limiting reactions. Typically, an ALD cycle includes operations to deliver and adsorb at least one reactant to the substrate surface, and then react the adsorbed reactant with one or more reactants to form at least a partial layer of film. As an example, a silicon oxide deposition cycle may include the following operations: (i) delivery/adsorption of a silicon-containing precursor, (ii) purging of the silicon-containing precursor from the chamber, (iii) delivery of an oxygen-containing reactant with an optional plasma, and (iv) purging of the oxygen-containing reactant and/or plasma from the chamber. When a plasma is used during delivery of the second reactant, in some embodiments, this is referred to as plasma-enhanced atomic layer deposition (PEALD). Delivery or adsorption of the silicon-containing precursor may be referred to as a "dose" operation and delivery of the second reactant to react with the adsorbed precursor may be referred to as a "conversion" operation.

Unlike a chemical vapor deposition (CVD) technique, ALD processes use surface-mediated deposition reactions to deposit films on a layer-by-layer basis. In one example of an ALD process, a substrate surface that includes a population of surface-active sites is exposed to a gas phase distribution of a first precursor, such as a silicon-containing precursor, in a dose provided to a chamber housing a substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of first precursor remaining in gas phase so that mostly or only the adsorbed species remain. In some implementations, the chamber may not be fully evacuated. For example, the chamber may be evacuated such that the partial pressure of the first precursor in gas phase is sufficiently low to mitigate a reaction. A second reactant, such as an oxygen-containing reactant, is introduced to the chamber so that some of these molecules react with the first precursor adsorbed on the surface. In some processes, the second precursor reacts immediately with the adsorbed first precursor. In other embodiments, the second reactant reacts only after a source of activation is applied temporally In some embodiments, a plasma is ignited during the second reactant dose. The chamber may then be evacuated again to remove unbound second reactant molecules. In some embodiments the chamber may not be completely evacuated. Additional ALD cycles may be used to build film thickness. Examples of silicon-containing first reactants (also referred to as silicon-containing precursors) and second reactants (also referred to as co-reactants) are provided below.

Schematically illustrated in FIG. 1 is a gas delivery system 100 for delivering reactants to a single station of a multi-station reaction chamber (not shown) which may be used to perform one or more ALD cycles. The figure illustrates a configuration of gas flow lines, manifolds, valves, regulators, filters, showerhead, etc. for providing for ALD reactant delivery. Gas lines are schematically indicated as thin solid lines with arrows indicating the direction of gas flow; valves are indicted in the figure with crossed lines within a circle; regulators by an arrow within a circle, manifolds by solid boxes labeled "Manifold"; filters with curved lines either side of a gas line, etc. Most of the gas flow lines route gas to the "showerhead" 110, which as shown in this schematic, is the device which delivers the ALD reactants to a reaction chamber which is not shown Thus, in reference to the particular embodiment of a gas delivery system 100 shown in FIG. 1, the delivery of film precursor (e g., silicon-containing film precursor) to the reaction chamber-relevant to the ALD dosing and adsorption step (see operation (i) above)—may involve introducing precursor from a liquid delivery system (labeled "LPDS") 120 to a heated injection manifold 125 (labeled "HIM") where it is mixed with a preheated (see "preheater" 124) inert carrier gas originating from gas source 130 ("Manifold A"). The carrier gas then carries the precursor to an array of four valves 169, 164, 165, 166 which as an assembly 160 can be referred to as a point-of-use valve manifold (PVM) due to its close proximity (in terms of gas flow distance) to the reaction chamber. In particular, from the PVM 160, with valve 165 open and valve 166 closed, the precursor and carrier gas are flowed directly to the showerhead 110 and then into the reaction chamber.

Likewise, delivery system 100 of FIG. 1 also illustrates delivery of oxidant to a reaction chamber for use in ALD-relevant to the generation of an oxidative plasma and its reaction with adsorbed silicon-containing precursor (see step (iii) above). Specifically, gas source 140 ("Manifold C") is shown as a source of $O_2$ and/or $N_2O$ gas which is flowed to the showerhead 110 through valve 169 of the PVM 160 shown in the figure. The presence of Manifold C 140 and also "Manifold D" 170 should also be noted in the context of this configuration as they may be used to deliver inert gases for post-dose purge (step (ii) above) and post-RF purge (step (iv) above). With regards to Manifold D 170, the gas delivery system 100 is configured such that purge gas sourced from Manifold D passes through "Preheater" 171 and then is flowed on two paths towards the showerhead. Purge gas flowing on both paths pass through a regulator (172 or 173) and then on through a filter (173B or 175B) flanked upstream and downstream by valves (173A and 173C or 175A and 175C). One path then proceeds directly to showerhead 110, while the other connects to POS 160 first, in order to purge any remaining reactant gases lingering in the POS device after the dosing step. Also, note that, in some embodiments, precursor may be removed from the volume surrounding a processing station within a reaction chamber by applying vacuum to the reaction chamber (e.g., through the operation of a valve-operated vacuum source) without employing the use of an inert purge gas.

In addition, also note that FIG. 1 exhibits a remote plasma source 195, employing a $NF_3$-based plasma (as indicated in the figure), whose fluidic coupling to the reaction chamber and process station is regulated by valve 116. Finally, note that in some embodiments, Manifold B 150 (as regulated by valve 144) may serve as a source of a co-reactant gas—for example, a nitrogen-containing co-reactant such as nitrogen ($N_2$) that is flowed to showerhead 110 through valve 165 of POS 160.

A conformal film can be deposited via PEALD by performing multiple PEALD cycles in sequence. Each layer deposited by PEALD is very thin, typical being formed from a single monolayer of silicon-containing precursor, depositing a film of any substantial thickness can involve many cycles, and therefore may be relatively time consuming. In many cases, PEALD cycle times are comparable to valve and flow control device operating times, meaning that the time taken for such flow control devices to provide a steady state flow of silicon-containing precursor and/or other reactants becomes the limiting factor preventing desired further reductions in cycle time. A steady-state flow of reactants can be established by leaving flow control devices in their open positions, and to divert the flow of reactants to and from the reaction chamber as required by the timing requirements of an PEALD cycle.

Figure 2:
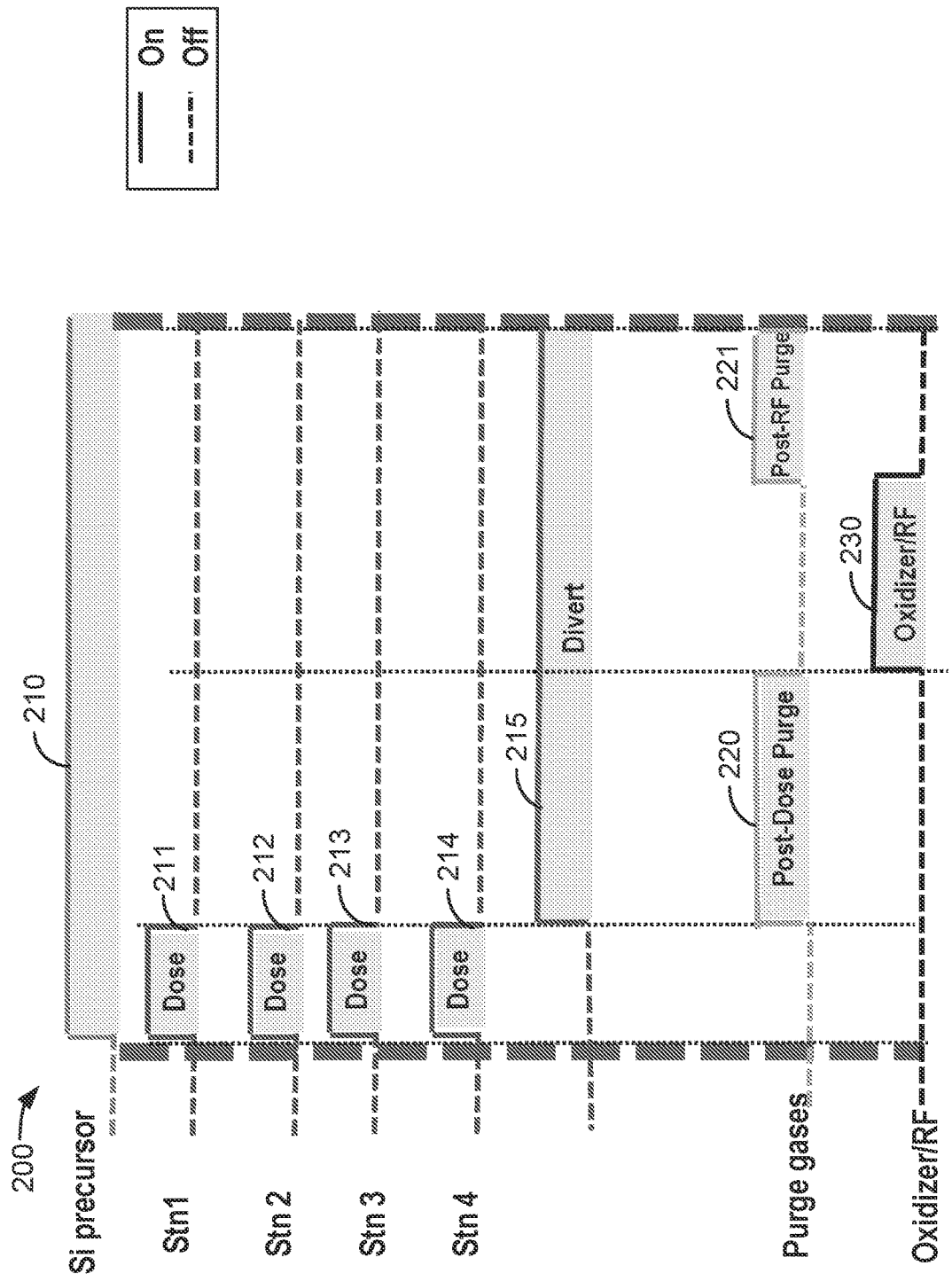
FIGS. 2 and 3 shows example timing diagrams for plasma enhanced atomic layer deposition (PEALD) of silicon oxide in a four-station chamber including divert of the silicon-containing precursor.
Figure 3:
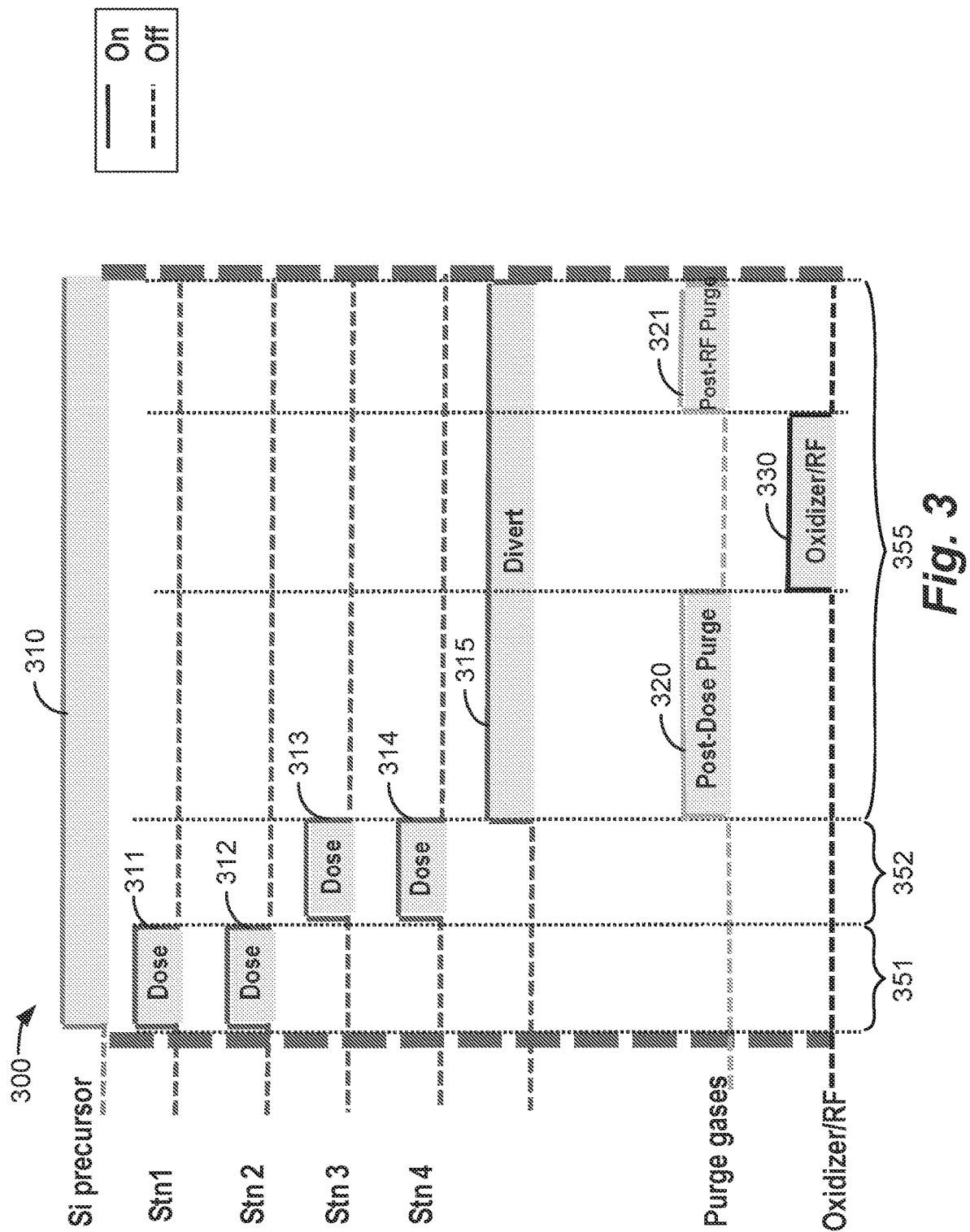

FIGS. 2 and 3 shows example timing diagrams for PEALD deposition of silicon oxide in a four-station chamber including divert of the silicon-containing precursor. FIG. 2 corresponds to concurrent dosing at four stations and FIG. 3 correspond to concurrent dosing at stations 3 and 4. It should be noted that the FIGS. 2 and 3 are provided by way of example. The methods described herein may be implemented with any number of stations, including single station chambers. For multi-station chambers, silicon-containing precursor doses may be performed in parallel and/or sequentially across all or a subset of stations.

Further, deposition of other materials including silicon nitride, silicon oxynitride, silicon carbide, silicon oxycarbide, silicon oxycarbonitride, etc. may be performed by appropriate reactant choice. For example, the RF oxidizer operation in the timing diagrams may be replaced by RF nitridation.

In FIG. 2, displayed from top to bottom in the timing diagram is a schematic illustration of silicon-containing precursor delivery to each of 4 processing stations (labeled "Station 1" through "Station 4") which is indicated by 4 traces 211, 212, 213, 214 showing precursor flow directed/redirected to each of the 4 processing stations. Schematically illustrated by a 5th trace 215 is precursor flow diverted to a divert flow path (i.e., not to the processing stations). These 5 traces (211, 212, 213, 214, and 215) represent a breakdown of the total precursor flow schematically illustrated by the top-most trace 210 in FIG. 2. The figure also schematically illustrates the timing of post-dose and post-RF purge gas flow—shown with trace 220/221 labeled "purge gases"—as well as the timing of oxidative plasma generation and reaction with adsorbed precursor—shown with trace 230 labeled "Oxidizer/RF." In the example of FIG. 2, a single gas delivery system like that shown in FIG. 1 may be used to flow precursor to each processing station in, for example, a 4-processing station configuration (possibly all contained within the same reaction chamber). In other embodiments, a dedicated gas delivery system for each processing station may be employed.

In the timing diagram of FIG. 2, the precursor dosing steps of the 4 ALD cycles are timed to coincide with one another. Thus, in step (i) (far left), substrates positioned at the 4 stations are simultaneously dosed with silicon-containing precursor which is allowed to adsorb onto the surface of each of the 4 wafers. For context, note that this could correspond to the opening of valve 164 in FIG. 1, while the other valves of the POS remain shut. After dosing step (i) concludes, the totality of precursor flow is diverted as illustrated by the "Divert" trace 215 in the figure. During the post-dose purge step (ii) (shown by the "Purge gases" trace 220 in FIG. 2), during the reaction of adsorbed precursor via activation with RF-generated oxidative plasma in step (iii) (shown by the "Oxidizer/RF" trace 230 in FIG. 2), and during the post-RF purge (also shown by the "Purge gases" trace 220 in FIG. 2), there is total diversion of the silicon-containing precursor.

For context, it should be noted that the transition between the "dose" traces and the "divert" trace could correspond to the closing of valve 164 and the opening of valve 166 of the POS as shown by the "Divert to Vacuum" label of FIG. 1. Likewise, with valves 164 and 166 in these positions (164 closed and 166 opened), the purging steps (ii) and (iv) indicated by the "Purge gases" trace 220 in FIG. 1 may be accomplished by the opening of valve 165, 169 remaining closed of course (and, in some embodiments, also accompanied by the opening of valves 162A and 162B for additional purge in the vicinity of the showerhead). The reaction via oxidative plasma step (iii) shown by the "Oxidizer/RF" trace 230 in FIG. 2 could correspond to the opening of valve 169 of the POS while the valve 165 (held open for the purge steps) is closed and 164 and 166 remain in their divert positions. It should be noted that the description of valve operation in reference to FIG. 1 is an example.

FIG. 3 shows a timing diagram similar to that of FIG. 2, but with a parallel execution of a sequence of 4 ALD cycles where the flow of silicon-containing precursor from a common source initially doses wafers at processing stations 1 and 2, and afterwards is redirected to dose wafers at stations 3 and 4.

One aspect of the disclosure relates to methods of depositing material with increased growth rates by PEALD. The methods may be used for gap fill including in deep features and may result in fast closure of voids within the feature. Example applications include gap fill of slits in 3D NAND structures to isolate memory stacks, other 3D NAND structures, DRAM structures, and shallow trench isolation (STI) structures. In some embodiments, the gaps may be high aspect ratio (HAR) gaps. Examples include gaps having aspect ratios of up to 35:1.

In some embodiments, the methods include controlling flow rates during the silicon-containing precursor dose. In some embodiments, the methods include allowing a silicon-containing precursor to flow into the station during at least part of the cycle that is after the dose. In some embodiments, the methods include controlling the timing sequence of the dose, purge, and RF operations. In some embodiments, the methods involve including low frequency RF (LFRF) component during the RF operation. According to various embodiments, any one or more of the above methods to increase growth rates is employed. The methods may increase growth rates by adding a CVD-type component to the ALD deposition.

Controlling flow rates during the silicon-containing precursor dose can involve reducing the total flow rate of the silicon-containing precursor and carrier gas by decreasing the carrier gas. This increases the concentration of silicon-containing precursor during the dose. As an example, a total flow rate per station may be 2000-4000 standard cubic centimeters per minute (sccm) of silicon-containing precursor and argon or another carrier gas. The silicon-containing precursor:carrier gas volumetric flow rate ratio during the dose may be, for example, 1:4-3:1 or 3:5-5:2. This can be compared to a ratio of 1:6-1:5 for a process without increased growth rate.

Allowing the silicon-containing precursor to flow into the chamber during a purge can be performed in various manners. For example, a valve to the showerhead may be left open with no divert of the silicon-containing precursor gas during at least part of time between the dose and RF operations. This allows silicon-containing precursor to continue to flow into the station.

Figure 4:
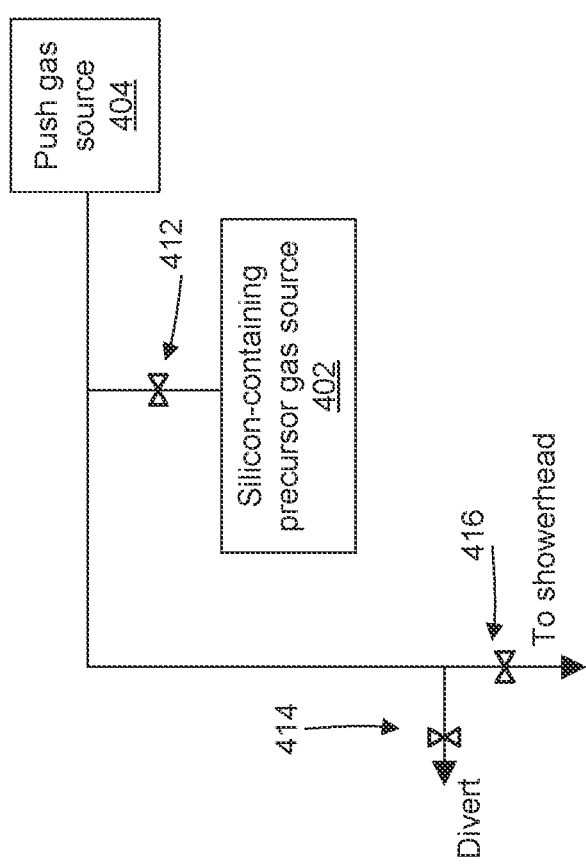
FIG. 4 shows a simplified schematic of a portion of a gas delivery system for delivering
a silicon-containing precursor.

In some embodiments, flow into the chamber may be controlled entirely at the silicon-containing precursor gas source. FIG. 4 shows a simplified schematic of a portion of a gas delivery system for delivering a silicon-containing precursor. Silicon-containing precursor gas source 402 may include, for example, a vapor-draw ampoule, a silicon-containing precursor source, and an inert gas source. The ampoule may be configured to receive silicon-containing precursor and an inert gas and to vaporize the silicon-containing precursor. A push gas may be supplied from push gas source 404 to push the silicon-containing precursor/inert gas mixture to a showerhead as shown. Three valves are depicted in the simplified schematic of FIG. 4. An outlet valve 412 controls the flow at the silicon-containing gas source. An inlet valve 416 to the showerhead controls flow into the station through its showerhead. Also shown is a divert line include a divert valve 414. The gas distribution system shown in FIG. 4 may be, for example, part of a gas distribution system as described above with respect to FIG. 1.

In certain embodiments, during at least a portion of the post-dose purge of an ALD cycle, the inlet valve 416 is open and with the divert valve 414 closed. This allows flow of the silicon-containing precursor gas to be controlled by outlet valve 412. Even after the outlet valve 412 is closed, some amount of silicon-containing precursor gas is in the line and can enter the station.

FIGS. 5-8 provide examples of timing sequences for PEALD deposition of silicon oxide that include a CVD-type component. As described above with respect to FIGS. 2 and 3, these sequences are not limited to deposition of silicon oxide or RF oxidation process. Deposition of other materials including silicon nitride, silicon oxynitride, silicon carbide, silicon oxycarbide, silicon oxycarbonitride, etc. may be performed by appropriate reactant choice. For example, the RF oxidizer operation in the timing diagrams may be replaced by RF nitridation.

Figure 5:
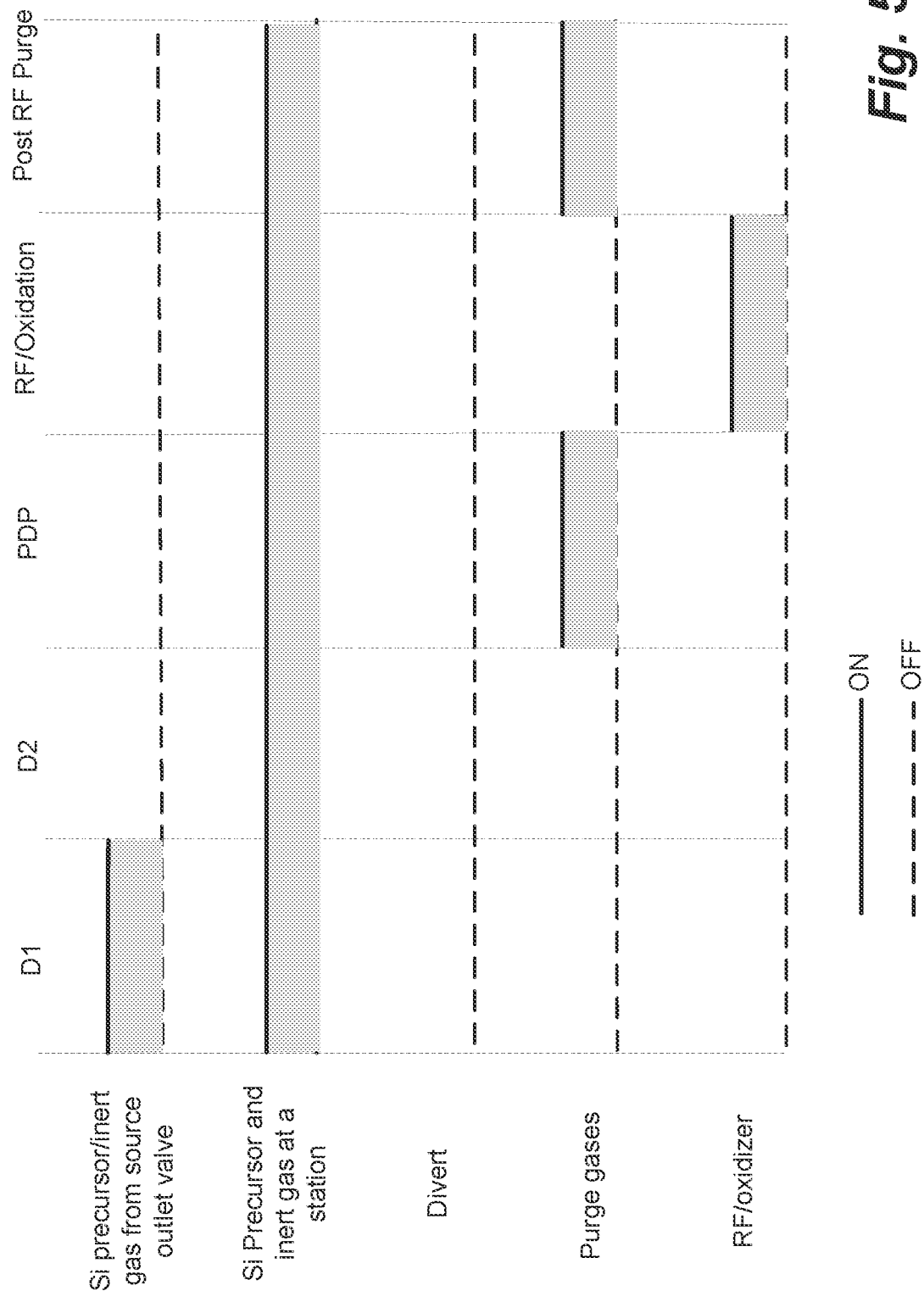
FIGS. 5-9 provide examples of timing sequences for PEALD deposition of silicon oxide that include a CVD-type component.

First. referring to FIG. 5, an example timing sequence for deposition of silicon oxide is shown. Five stages are shown in FIG. 5: two doses (D1 and D2), a post-dose purge (PDP), RF/oxidation, and post RF purge. The topmost trace shows the flow of Si-containing precursor and inert gas from a Si-containing precursor source outlet valve. An example is outlet valve 412 in FIG. 4. The second to topmost trace is the flow of Si-containing precursor and inert gas into a station. In the example of FIG. 4, the inert gas may come from the silicon-containing precursor gas source 402 in FIG. 4 and push gas source 404. Divert, purge gases, and RF/oxidizer are also shown.

During dose D1, the outlet valve from the Si-containing precursor gas source is open. This is similar to the dose steps in FIGS. 2 and 3. Once the outlet valve is closed, the flow of Si-containing precursor and inert gas stops from the Si-containing precursor gas source. Some amount of Si-containing precursor remains in the lines and the showerhead. During dose D2, this Si-containing precursor and inert gas continue to flow into the station. This is shown by the second to the topmost trace. Note that the while there is no continuing supply of Si-containing precursor from the silicon-containing precursor gas source during D2, there may be inert gas supplied from an inert gas source in some embodiments. For example, in FIG. 4, inert gas may continue to flow from push gas source 404.

The sequence in FIG. 5 differs from that in FIG. 2, with the latter diverting flow of any Si-containing precursor after the dose. In the example of FIG. 5, any precursor remaining in the lines is allowed to continue to flow into the station throughout the cycle with no divert. This includes during the post-dose purge, when purge gas is flowed, during the RF/oxidation stage, and during the post RF-purge. While the Si-containing precursor and inert gas continue to flow into the station during D2, the total flow and amount of Si-containing precursor in the flow decrease as there is no new Si-containing precursor supplied from its source. In some embodiments, they may continuously decrease throughout the process.

Figure 6:
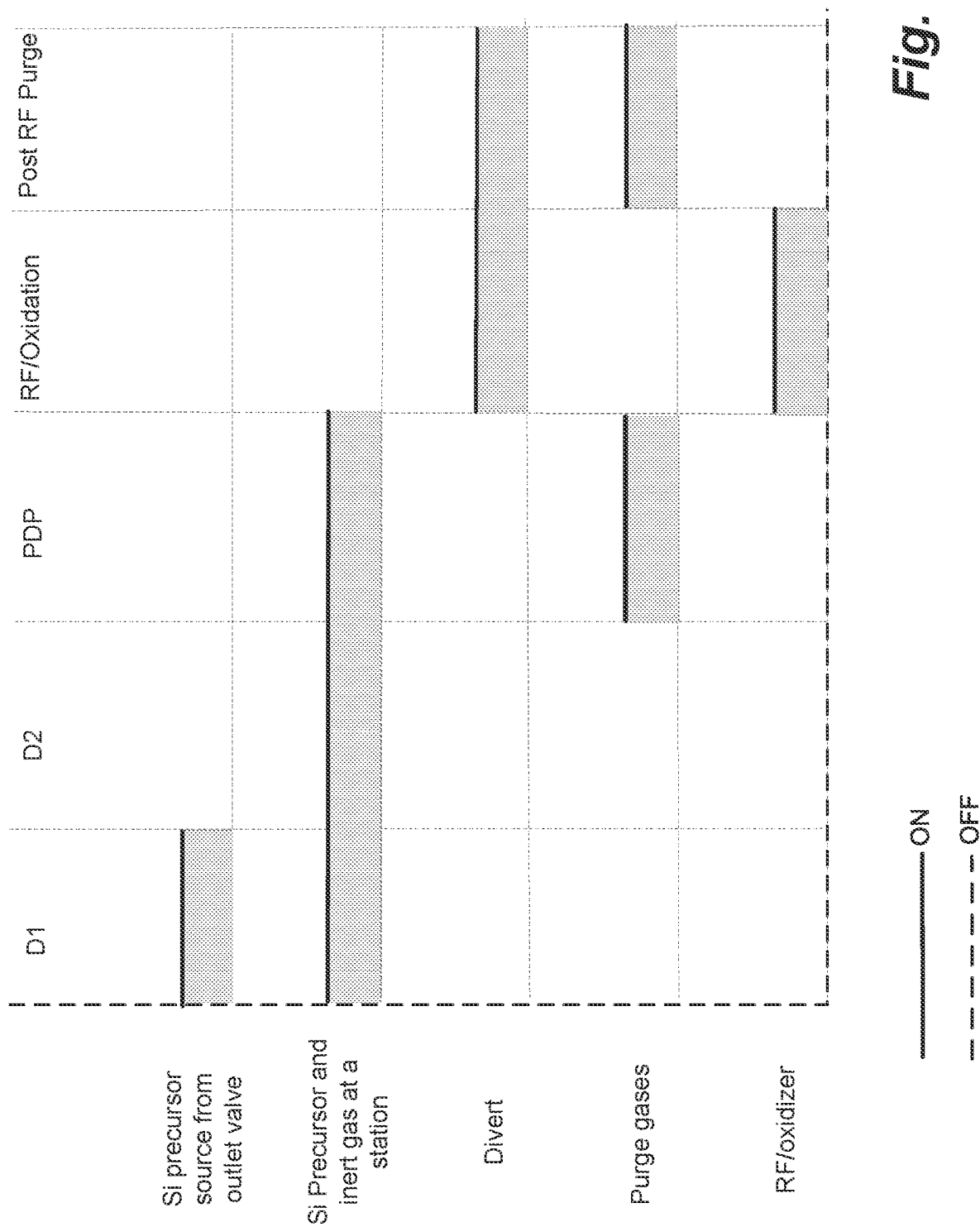

In some embodiments, a divert may be used during a portion of the cycle. FIG. 6 shows another example of timing sequence that includes a D2 dose stage, as in FIG. 5. In the example of FIG. 6, the precursor flow is diverted for the RF/oxidation and post RF purge stages. In alternate embodiments, the divert may be started at the beginning of the PDP stage, or at any point during the PDP or RF/oxidation stages. In the examples of FIGS. 5 and 6, the flow to the station includes silicon-containing precursor and inert gas that may be in the showerhead or in the line downstream of the divert valve 414.

Figure 7:
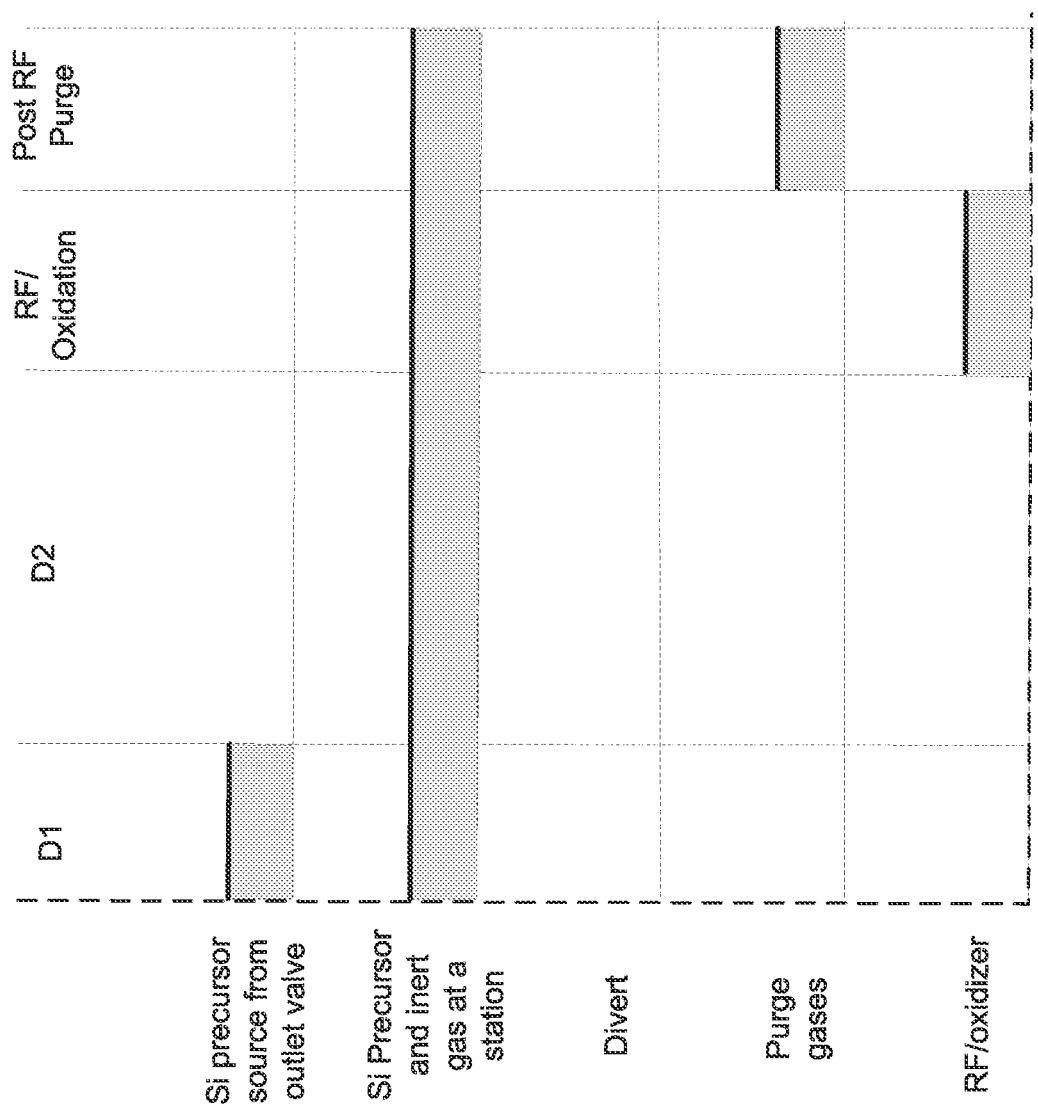
Figure 8:
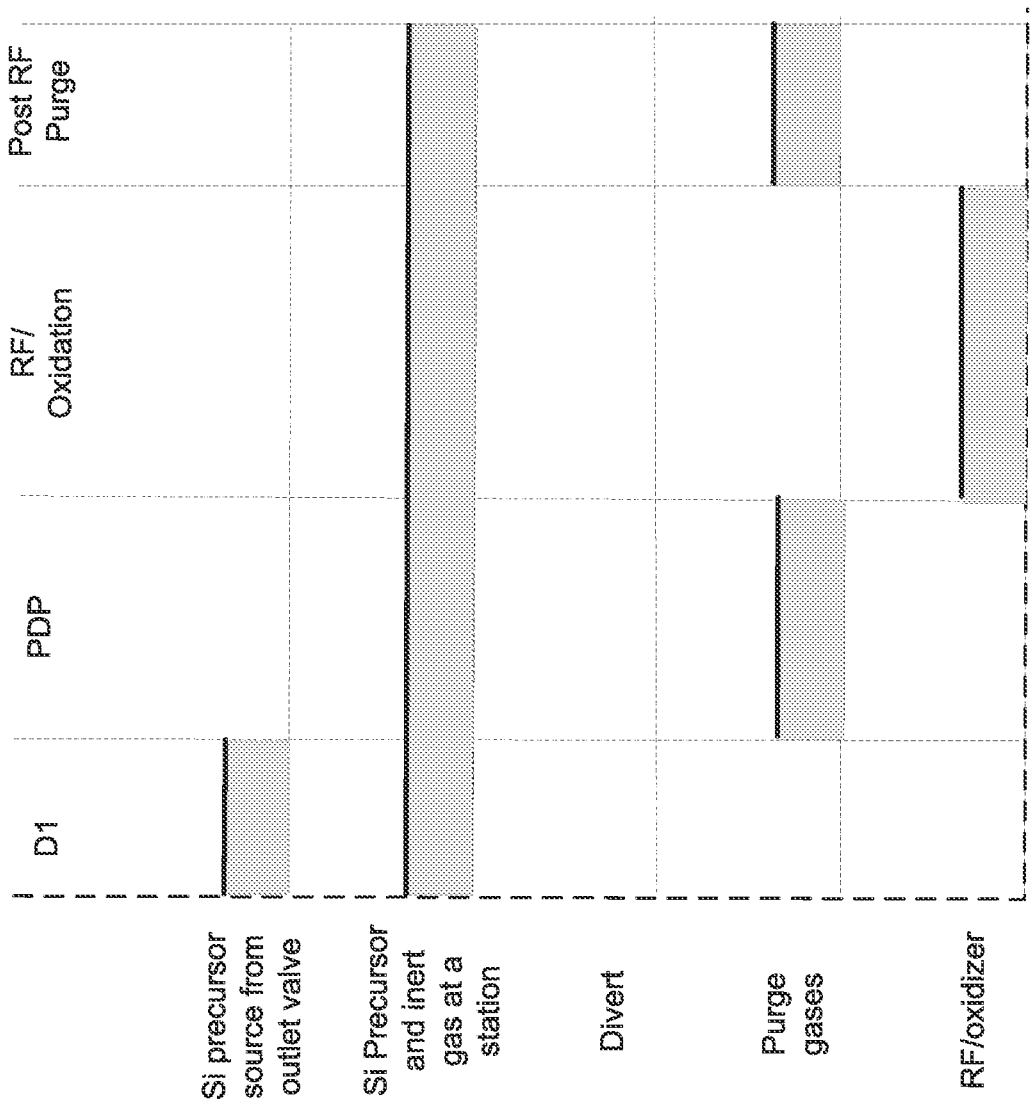

Allowing the precursor to flow into the station after the D1 stage can facilitate providing a CVD-type component to the deposition process. Non-adsorbed precursor that is present in the station during the RF/oxidation stage will react in a CVD-type reaction. The amount of film deposited by the CVD-type component of the deposition process can be controlled by several parameters, including the presence, absence, and timing of D2 stage and a divert. More precursor will be present during the RF/oxidation stage using the timing diagram of FIG. 5 than using the timing diagram of FIG. 6. The presence, purge amount, and timing of the PDP stage may also be used to control the CVD-type component. To increase the CVD-type component, the amount of purge gas flowed during the PDP stage and/or the duration of the PDP stage can be reduced. In some embodiments, a post-dose purge may be omitted as shown in FIG. 7. In some embodiments, the D2 stage may be omitted, with the PDP stage beginning at the end of the D1 stage. Silicon-containing precursor may still flow to the station without divert as shown in the timing diagram of FIG. 8.

Another parameter to control the CVD-type component of the deposition is the time between the end of the D1 phase (or dose as referred to in FIGS. 2 and 3) and the onset of the RF/oxidation. This time includes the D2 and/or PDP stages. Example times range from 5 milliseconds to 500 milliseconds. At the lower end of this range, the deposition has more of CVD-type component. At the higher end of the range, the deposition may be mostly ALD.

In some embodiments, during the oxidation or nitridation, the RF is supplied with a low frequency (LF) component as well as a high frequency (HF) component. In such embodiments, some of the deposited dielectric is sputtered from the feature top and re-deposited further within the feature. In some embodiments, the HF component is relatively high to obtain good conversion to an oxide, nitride, or other desired film. For example, the HF component may be between 4 kW-10 KW, divided among 4 stations, or 1 kW-2.5 KW per station. The amount of sputter and re-deposition may be tuned by controlling the LF power. In some embodiments, the LF power may the same as or lower than the RF power. For example, the LF component may be 500 W-10 KW, divided among four stations, or 125 W-2.5 KW per station. In some embodiments, the LF power is 500 W-5 KW, divided among four stations, or 125 W-1250 W per station. The per station power may be used for chambers having any number of stations. The HF frequency is about 13.56 or 27 MHz, while the LF frequency is between about 300-400 KHz.

The sputter and re-deposition may also be controlled by the flow rate of an inert gas such as argon (Ar). In some embodiments, a high argon Ar gas flow is used during the RF stage to increase the sputter and re-deposition. For example, an Ar flow rate of up to about 50 standard liters per minute (slm) for four stations, or up to 12.5 slm per station. At the lower end, an Ar flow rate of about 3.5-10 slm, or 875 sccm-2.5 slm may per station may be used during the RF stage. In some embodiments, an Ar flow into a station may be increased for the RF stage only.

In some embodiments, a CVD-type component is controlled using the RF purge (RFP). The oxidant or other co-reactant is not completely purged and allowed to remain in the chamber to react with the precursor in the next dose stage. This may be done in addition to or instead of the controlling the dose and/or PDP as described above. An example timing diagram is shown in FIG. 9.

Figure 9:
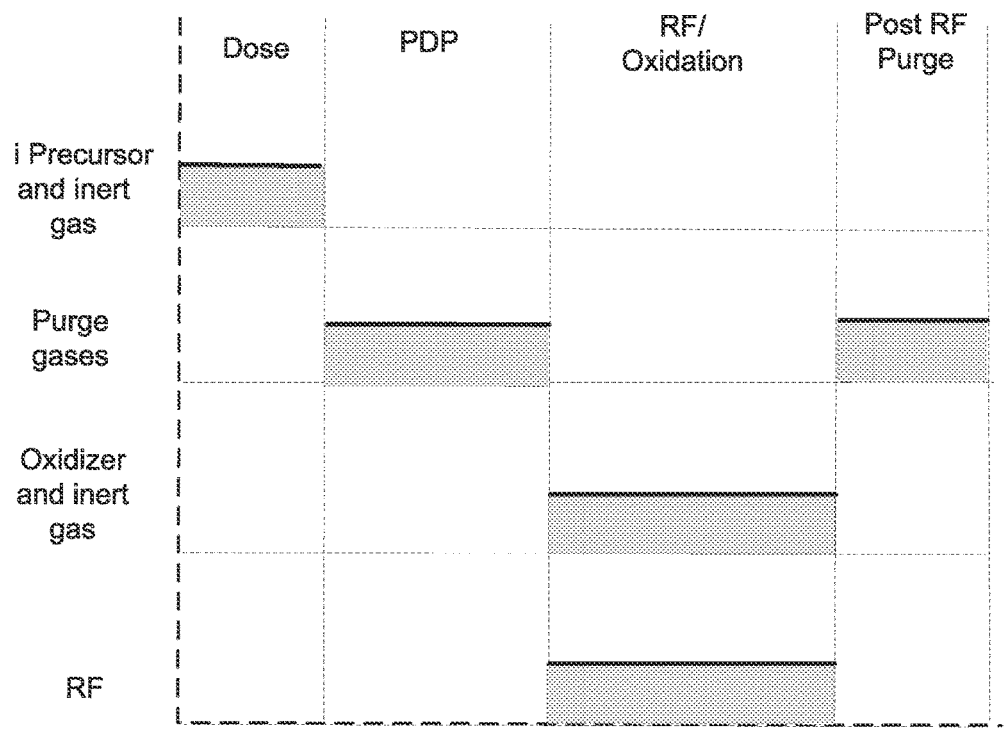

FIG. 9 shows four stages in a cycle: dose, PDP, RF/oxidation, and RFP. In the example shown, the Si precursor and inert gas are at the station during the dose. In some embodiments, a divert (not shown) may be used to direct the precursor away from the station during the dose. In alternate embodiments, the precursor may be allowed to continue to flow into the chamber after the dose. In FIG. 9, the oxidant is turned off and/or diverted at the same time as the plasma is extinguished. In alternate embodiments, it may be allowed to continue to flow into the chamber after the RF is off.

By appropriately controlling the timing of the RFP, a CVD-type component can be introduced during the subsequent dose Purge flow and the amount and concentration of oxidizer (or other co-reactant) can also be controlled to affect the CVD-type component. By reducing the RFP time and/or increasing the amount and/or concentration of the oxidizer, oxidizer species are allowed to be present during the next dose phase where they react with precursor. The oxidizer species may be molecules and/or radicals or other afterglow plasma species. RF power (HF and/or LF) may also be increased to increase reactivity of the remaining species. Examples of RFP times range from 0.5 to 5 seconds. Examples of purge flows range from 5 lpm to 45 lpm (though will depend on the geometry and size of the particular reactor.)

In some embodiments, RFP time is less than 1 second. RFP times of 1 second or greater are likely to result in pure ALD. By contrast, at 0.1 second RFP with low purge flows, the CVD-type component is high. In some embodiments, RFP time is less than 0.9 s, 0.8 s, 0.7 s, 0.6 s, 0.5 s, 0.4 s, 0.3, or 0.2 s.

Figure 10:
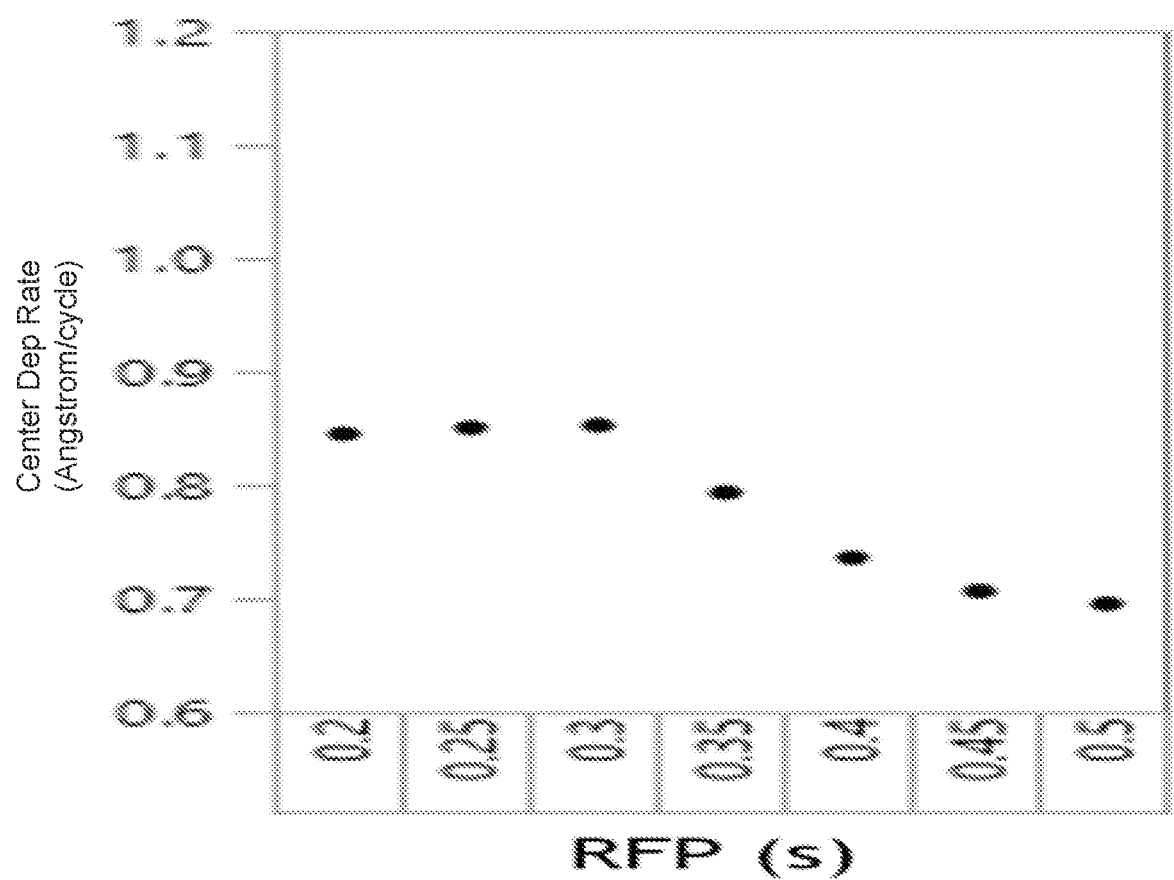
FIG. 10 shows an example of deposition rate as a function of RF purge time, holding all other process parameters constant.

FIG. 10 shows an example of deposition rate as a function of RFP time, holding all other process parameters constant. RF power of 5000 W was used. For the example process, deposition rate is higher for RFP time of about 0.3 s or below, then decreases with increasing RFP time. At 0.5 seconds, the process is at or close to pure ALD. RFP times that result in strong or weak CVD-type components or pure ALD depend on purge flows, amount of oxidizer, concentration of oxidizer, RF power, etc.

Figure 11A:
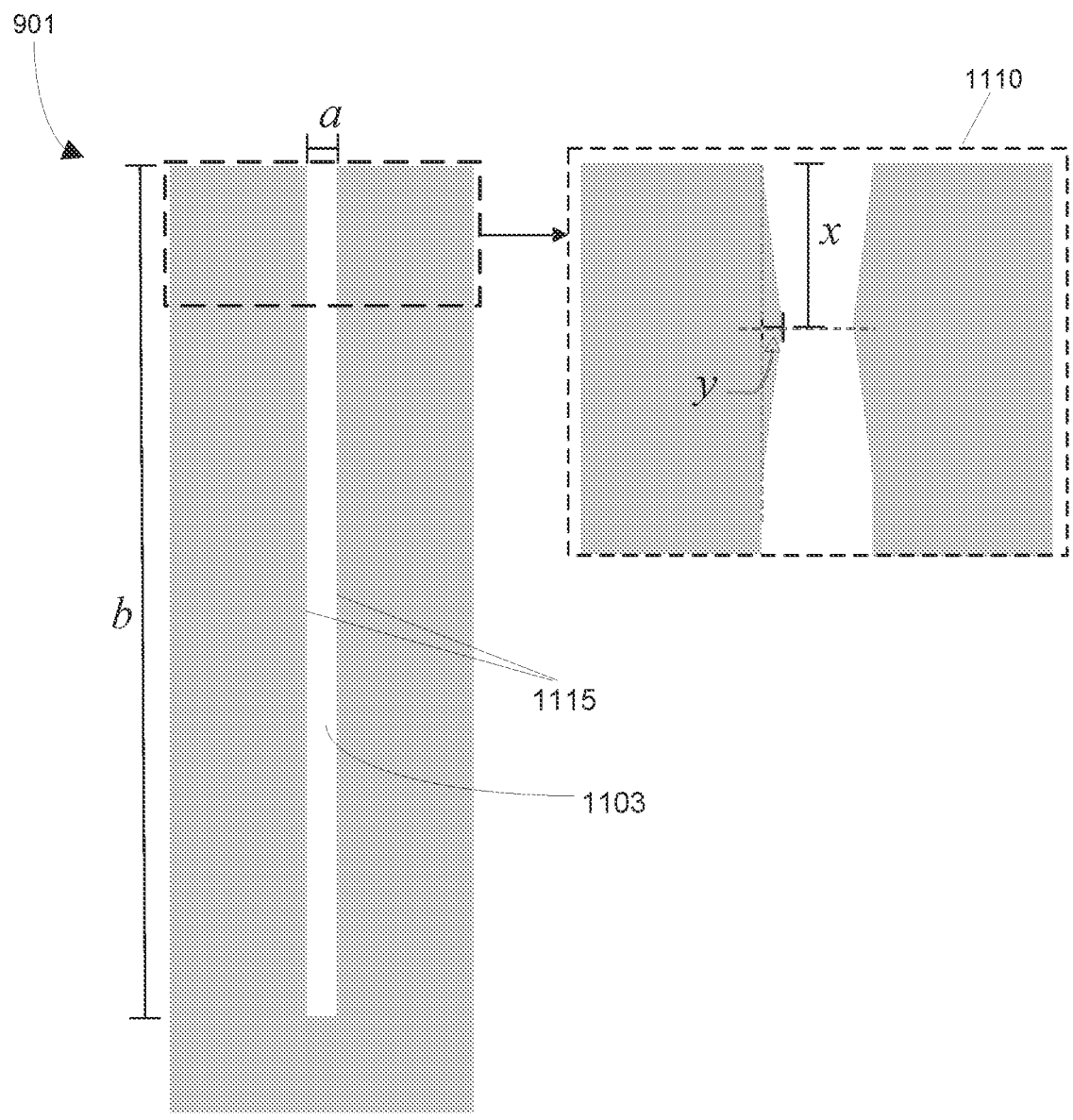
FIG. 11a shows an example of a structure including an unfilled gap that may be filled using methods described herein.

As described above, the methods may be implemented for a variety of applications, including memory and logic applications. In some embodiments, the methods may be used for gap fill. FIG. 11*a* shows an example of a feature 1101 including an unfilled gap 1103 between sidewalls 1115. In the figure, the width "a" and height "b" are indicated. Width may be a diameter. The aspect ratio (A/R) is given by b/a as indicated. The sidewalls 1115 are generally vertical. However, there may be some re-entrancy. Re-entrancy is narrowing from the bottom of the feature up. The inset 1110 shows that re-entrancy of a thickness "y" at a depth "x" in the feature. The sidewall surfaces may include one or more dielectric, conductive, or semi-conductive materials. In some embodiments, gap may be lined with a liner film.

Figure 11B:
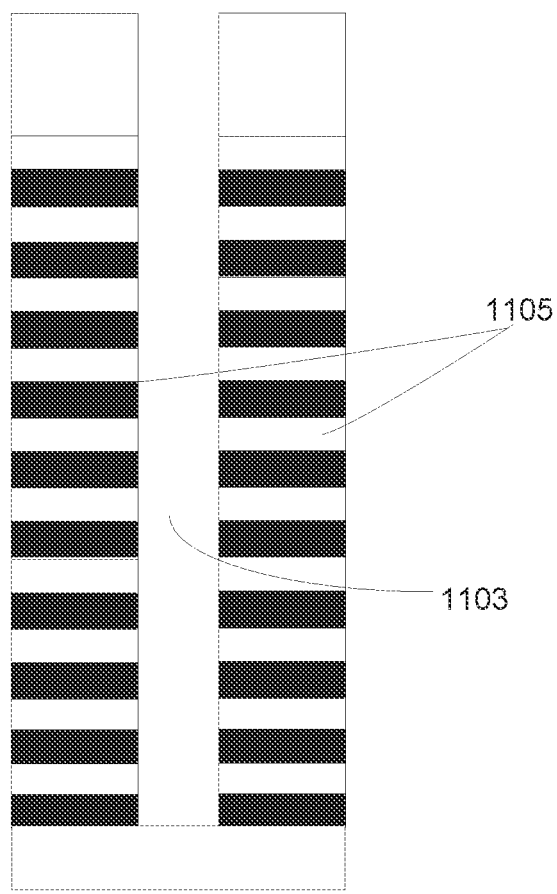
FIG. 11b shows an example of a structure including an unfilled gap between two memory stacks that may be filled using methods described herein.

In some embodiments, the methods are implemented to fill gaps during fabrication of a 3D NAND structure. For example, after etching slits in alternating silicon oxide/silicon nitride (ONON) layers, dielectric may be deposited in the slits. FIG. 11*b* shows an example of a structure including a gap 1103 between two memory stacks 1105. Each stack may include between 2 and 256 or more pairs of alternating oxide/nitride layers. According to various embodiments, the stacks may be lined with a layer, e.g., a polysilicon layer. During fill of the gap 1103, an LF component may be added to the RF oxidation operation. Adding a LF component mitigates crack formation in the ONON stack. In some embodiments, this is due to crosslinking and/or stress in the sputtered and re-deposited film.

The methods may be used for dielectric gap fill of any appropriate structure including DRAM structures and shallow trench isolation (STI) and deep trench isolation (DTI) structures for logic device fabrication. In some embodiments, during gap fill methods may include inhibition and/or etch operations. For example, a PEALD timing sequence as described above may be used for deposition operations in a deposition-etch-deposition (DED) process to fill a gap.

Figure 11C:
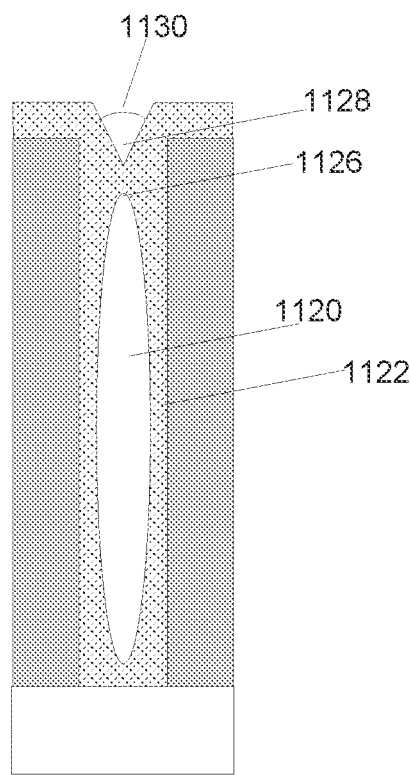
FIG. 11c shows an example of a structure including an air gap that may be formed using
the methods described herein.

In some embodiments, the methods described herein are used to form closed voids in hole and trench structures. FIG. 11c shows an example of a void 1120 formed between two features. Dielectric material 1122 is deposited in the gap between the features with the CVD-type component sufficient enough such that the void 1122 is formed as more dielectric material is deposited at the top of the feature. The techniques described above may be used to control the CVD-type component to form the void.

By forming a void (also referred to as an air gap) intra-level capacitance in semiconductor devices can be reduced. The methods may also be used to form air gaps in any appropriate context, including forming air gaps in MEMS devices. Examples of semiconductor structures include interconnects, conductive lines, or other conductive features. The method also may be implemented in any context in which air gaps capped by dielectric film between features are useful. Examples of structures include 3D NAND structures such as holes and slits, DRAM structures such as bitline structures, metal lines in back end of line (BEOL), logic gates, etc. The structures are characterized by having two or more adjacent features with an unfilled gap between the features. In many implementations, the features are conductive features, with the air gap to be formed providing very low k dielectric and reducing parasitic capacitance. However, the sidewalls surfaces of the features may be any material including conductive, dielectric, or semiconducting surfaces or a combination of these. For example, the structure may be copper (Cu) lines coated with a silicon carbide (SiC) film. The dimensions of the structure will also depend on the particular application. For example, an incoming DRAM structure may have a gap 25-50 nm wide and 300-800 nm deep and an incoming 3D NAND structure may be 50-350 nm wide and 5-8 microns deep. However, the method is not limited to any particular structure dimension, feature composition, or sidewall surfaces. In some embodiments it may be implemented in applications in which other techniques for forming air gaps (such as deposition and removal of a sacrificial material) are difficult to implement.

A formed void can be characterized by placement and shape of the top of the void, shown at 1126. The void location can be tuned by the amount of RF time and/or sputter amount. The top of the void is generally some amount below the tops of the features to ensure the void remains closed during further processing. In some embodiments, the top of the void is rounded as shown in FIG. 11c. A rounded top helps prevent cracking.

The feature including a void can further be characterized by an indentation 1128 that forms a result of the deposition. Sputtering as described above widens the indentation angle 1130. In some embodiments, the indentation angle is greater than 50°, greater than greater than 55°, greater than 60°, greater than 65°, greater than 70°, greater than 75°, greater than 80°, or greater than 85°.

In some embodiments, the processes may include periodic exposure to an inhibition plasma. The inhibition plasma creates a passivated surface and increases a nucleation barrier of the film. When the inhibition plasma interacts with material in the feature, the material at the bottom of the feature receives less plasma treatment than material located closer to a top portion of the feature or in field because of geometrical shadowing effects. Deposition at the top of the feature is selectively inhibited and deposition in lower portions of the feature proceeds with less inhibition or without being inhibited. As a result, bottom-up fill is enhanced, which creates a more favorable sloped profile that mitigates the seam effect and prevents void formation. Halogen-containing plasmas can be effective inhibition plasmas. For example, for some applications, a plasma generated from nitrogen trifluoride ($NF_3$) may provide an inhibition effect in a substantially reduced time compared to a plasma generated from molecular nitrogen ($N_2$). However, halogen-containing plasmas may also act as an etchant. For example, while performing an inhibition, an atom hitting a surface with low energy can act as an inhibitor while a high energy atom can remove material. Because the plasma has an energy distribution, some component of the plasma may hit near the top of the feature and etch. Any dielectric etched is replaced during deposition. If underlying material (e.g., polysilicon (poly Si), a metal oxide, etc.) is removed, it is not replaced and can affect device performance.

Figure 12A:
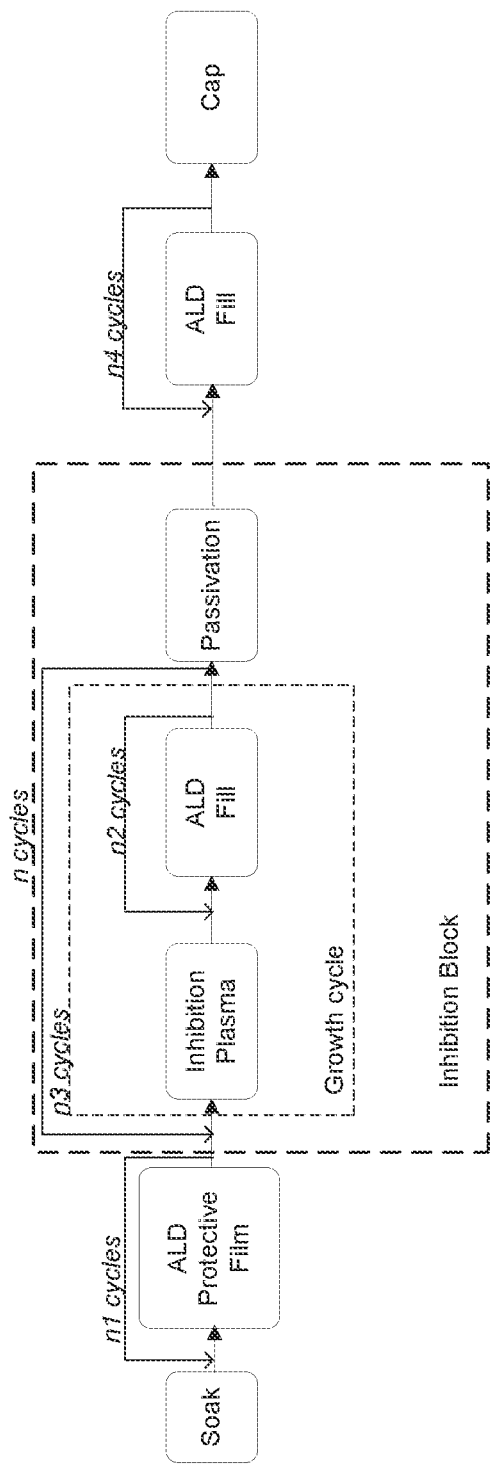
FIG. 12a shows an example of a process sequence that may be used in accordance with the disclosed embodiments including deposition of a protective film.

In some embodiments, the methods are implemented to form a protective film at the top of a gap. This film may be referred to as a "helmet" at the top of the gap and can protect against damage from inhibition plasma. FIG. 12a shows an example of a process sequence that may be used in accordance with the disclosed embodiments. In the example of FIG. 12a, multiple ALD operations are shown. Any one or more of these may use one or more of the techniques described above to include a CVD-type component.

The process sequence in FIG. 12a includes deposition of a protective film prior to exposure to an inhibition plasma. Other operations (e.g., soak, passivation) may be omitted in certain embodiments and operations may be added in certain embodiments. In the example process sequence of FIG. 12a, one or more wafers undergo gap fill The process may begin with a soak after being provided to a deposition chamber. This can be useful, for example, to remove particles or another pretreatment. Then, n1 cycles of ALD deposition of protective film are performed. Further details of the protective liner ALD are discussed below. After the protective film is deposited, n inhibition blocks are performed, with the operations of one inhibition block shown. The first operation of the inhibition block is the inhibition plasma, which is a surface treatment. As discussed above, the plasma may include halogen species including anion and radical species such as $F^-$, $Cl^-$, $I^-$, $Br^-$, fluorine radicals, etc. Other inhibition plasmas may be used, with a protective film providing protection from any plasma that can damage a structure. For example, plasmas generated from molecular nitrogen ($N_2$), molecular hydrogen ($H_2$), ammonia ($NH_3$), amines, diols, diamines, amino alcohols, thiols or combinations thereof may be used as inhibition plasmas. If conditions such as temperature, RF power, and sensitivity of the underlying material are such that plasma damage may occur with these, the protective film may be used. In some embodiments, a halogen-containing gas (e.g., $NF_3$) is used. It may be heavily diluted with another gas, such as oxygen ($O_2$) to control the inhibition and prevent etching. For example, in some embodiments, an oxidant: halogen volumetric flow ratio may be at least 5:1 or at least 10:1.

When the inhibition plasma interacts with material in the feature, the material at the bottom of the feature receives less plasma treatment than material located closer to a top portion of the feature or in field because of geometrical shadowing effects. As a result, deposition at the top of the feature is selectively inhibited and deposition in lower portions of the feature proceeds with less inhibition or without being inhibited. In FIG. 12a, the next operation in the inhibition block is n2 cycles of ALD fill. The dielectric material is deposited selectively at the bottom of the feature. The inhibition plasma and the n2 cycles of ALD fill together make a growth cycle. A growth cycle can be repeated n3 times to continue filling the feature with intermittent inhibition operations when the inhibition effect diminishes. The number of growth cycles in an inhibition block may depend on the re-entrancy of the feature. Features that exhibit more re-entrancy may use a longer inhibition time or multiple inhibition blocks. In the example of FIG. 12a, the inhibition block ends with a passivation operation. This is a surface treatment that removes residual inhibitor and can also densify the deposited film. In some embodiments, an oxygen plasma is used. In some embodiments, a passivation cycle may be omitted.

One or more additional inhibition blocks, including growth cycle and passivation, may be performed for a total of n inhibition blocks. The number of inhibition blocks depends on how much material is used to fill the feature. Inhibition plasma, ALD, and passivation conditions may be changed from inhibition block to inhibition block to fill the feature. For example, an inhibition plasma duration may be 20 seconds until the bottom quarter of the feature is filled (inhibition block 1), then changed to 5 seconds for the middle 50% of the structure (inhibition block 2), etc.

When the feature is nearly filled, inhibition may no longer be necessary, and the fill can be completed with n4 cycles of ALD fill. In some embodiments, a cap or overburden layer of dielectric may then be deposited. Plasma enhanced chemical vapor deposition (PECVD) may be used at this stage for a fast deposition.

Figure 12B:
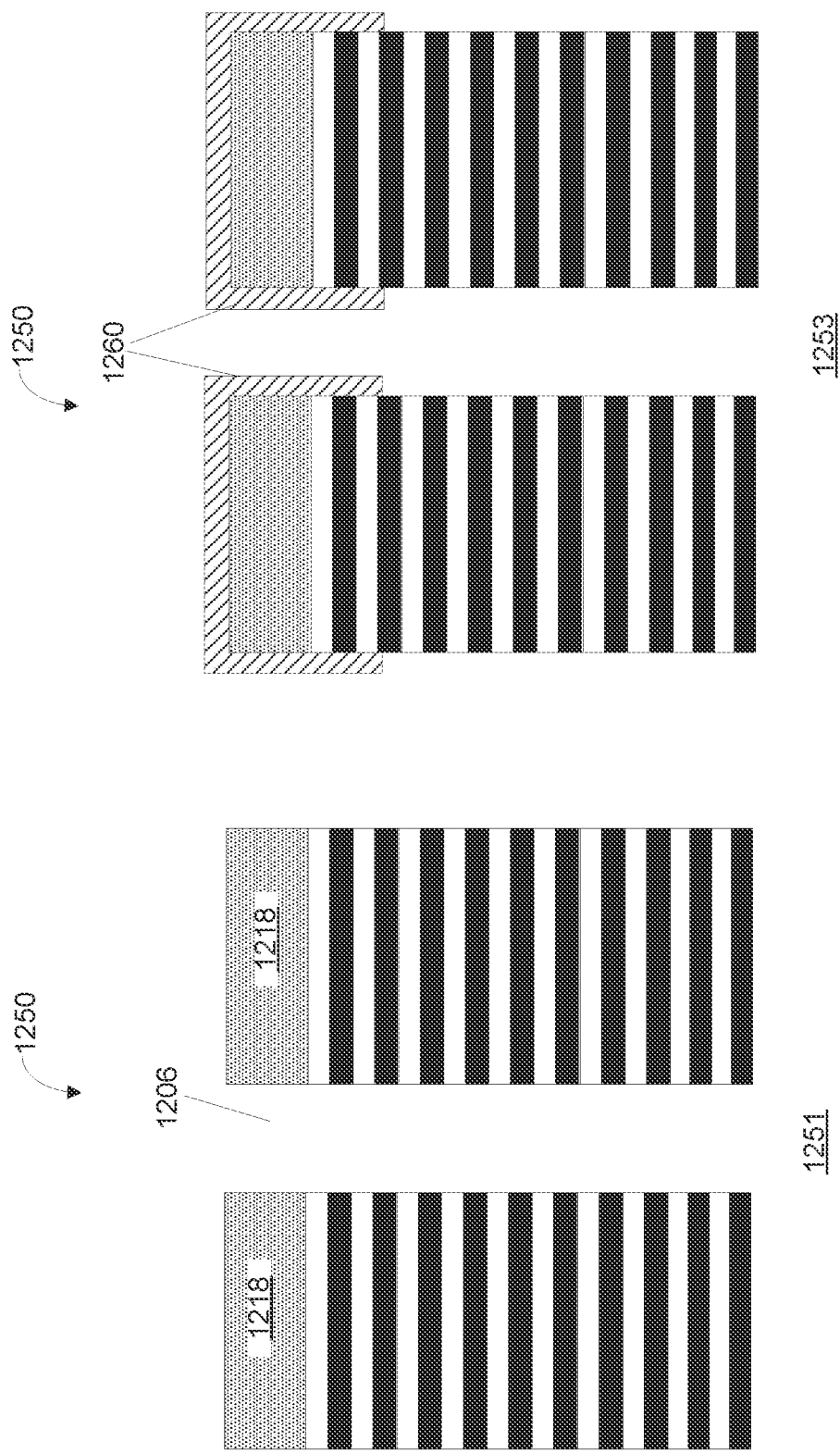
FIG. 12b shows an example of a structure before and after deposition of a protective film.

In some embodiments, a protective film is deposited using a CVD-type component as described above. FIG. 12b shows an example of a 3D NAND structure 1250 with poly Si 1218 at the top of an ONON stack. At 1251, the poly Si 218 is vulnerable if exposed to an inhibition plasma used to fill the gap 206. At 1253, a protective film 1260 is shown. In particular embodiments, an inlet valve controlling silicon-containing precursor to the showerhead is open and with no divert valve closed. This allows flow of the silicon-containing precursor gas to be controlled by an outlet valve of the silicon-containing precursor source. As discussed above, with respect to FIG. 4, after the outlet valve is closed, some amount of silicon-containing precursor gas is in the line and can enter the station. In the same or other embodiments, LF power is used during formation of the protective film.

Allowing silicon-containing precursor to flow into the station during deposition of the protective liner allows the protective film to be deposited much more quickly than an ALD process without a CVD-type component. Providing an LF component can also improve deposition and provide a film with higher uniformity and higher refractive index (RI) than an HF-only deposited film. See FIG. 13, which shows thickness non-uniformity (NU) and refractive index (RI) for films deposited using a silicon-containing precursor/purge/N$_2$ plasma/purge sequence at 10 Torr by PEALD with 1000 W HF+1500 W LF (triangle) and with 1000 W HF only. NU is significantly lower and RI higher for the HF+LF deposited film. RI is inversely correlated with etch rate. Thus, the HF+LF deposited film is more etch resistant. Deposition rate is also shown at multiple pressures and is higher for the HF+LF deposited film.

The protective film may be formed from a material that is relatively etch resistant to the inhibition plasma. Examples of protective liners include silicon nitrides, silicon carbides, and silicon oxides (including silicon oxynitrides, silicon oxycarbides, silicon carbon nitrides, etc.). Any material may be used that is compatible with the inhibitor gas and has a high selectivity (low etch rate) in the inhibitor compared to the underlying film.

Silicon oxide has lower resistance than silicon nitride or silicon carbide to fluorine-based or similar plasmas and may be used only in certain circumstances. These can include one or more of the following: the inhibition plasma being relatively weak, the inhibition plasma applied only for a short duration, and the feature dimensions allowing a fairly large amount of protective film deposited without pinching off the feature during the fill.

Figure 13:
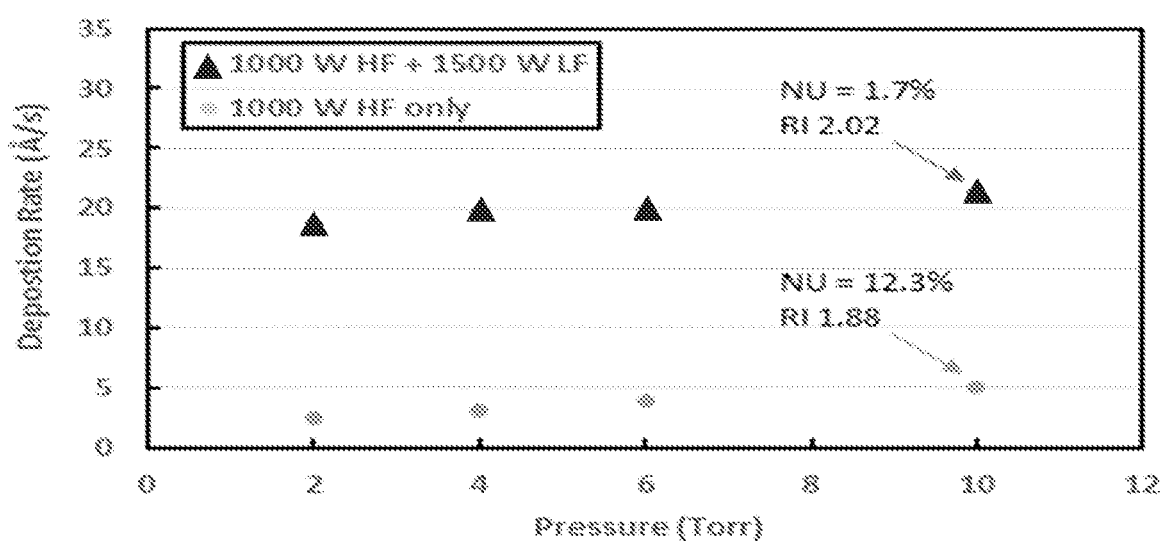
FIG. 13 shows thickness non-uniformity (NU) and refractive index (RI) for films deposited using PEALD with high frequency RF power only and high frequency RF power and low frequency RF power.

Silicon nitride (SiN) may be deposited using a N$_2$ plasma or other nitrogen-containing plasma. In some embodiments, no oxidant is used during SiN deposition. However, at certain process conditions, ambient conditions may lead to the formation of silicon oxide rather than silicon nitride. The use of LF during SiN protective film deposition results in formation of a nitride rather than an oxide. Referring to FIG. 13, for example, the HF-only deposition has a RI that indicates a significant portion of the film is an oxide rather than a nitride. The HF/LF-deposited film has an RI consistent with that of a nitride. LF RF power may be limited to avoid excessive sputtering. In some embodiments, the amount of LF power is between 1 and 2 KW for four stations (or 250 W to 500 W per station). SiN films may also be deposited by using extremely low pressures at which little oxygen is present and/or using longer RF times. Silicon carbides may be deposited using a carbon-containing co-reactant (e.g., reacting silane with methane)

In many embodiments, the material is sacrificial and removed during inhibition and so not particularly limited. The depth of protective film may be determined by determining the depth that the inhibition plasma damages the underlying layer in the absence of the protective liner. This may be done experimentally, by modelling, or a combination of these. The protective film may be deposited to a thickness such that it will protect the underlying layer through the inhibition plasmas but be removed by the end of the last inhibition plasma. This can be determined experimentally and/or from known etch rates. Example thicknesses may range from tens to hundreds of Angstroms. In some embodiments, some amount of protective film may remain after gap fill. In such cases, a separate removal process may be implemented prior to filling the portion of the gap where the protective liner remains. In some embodiments, remaining protective film may be left in the device. In some embodiments, deposition of the protective film may be performed more than once—for example, every m inhibition blocks.

A CVD-type component in the PEALD process can facilitate depositing the protective liner preferentially at the top of the structure rather than conformally. As described above, in some embodiments, the silicon-containing precursor is allowed to flow throughout the process, or otherwise as described with respect to FIGS. 5-8. In some embodiments, LF RF plasma is used. Further, pressure may be kept relatively low (e.g., less than 20 Torr, or less than 15 Torr) to further facilitate non-conformal deposition of the protective liner.

Figure 14:
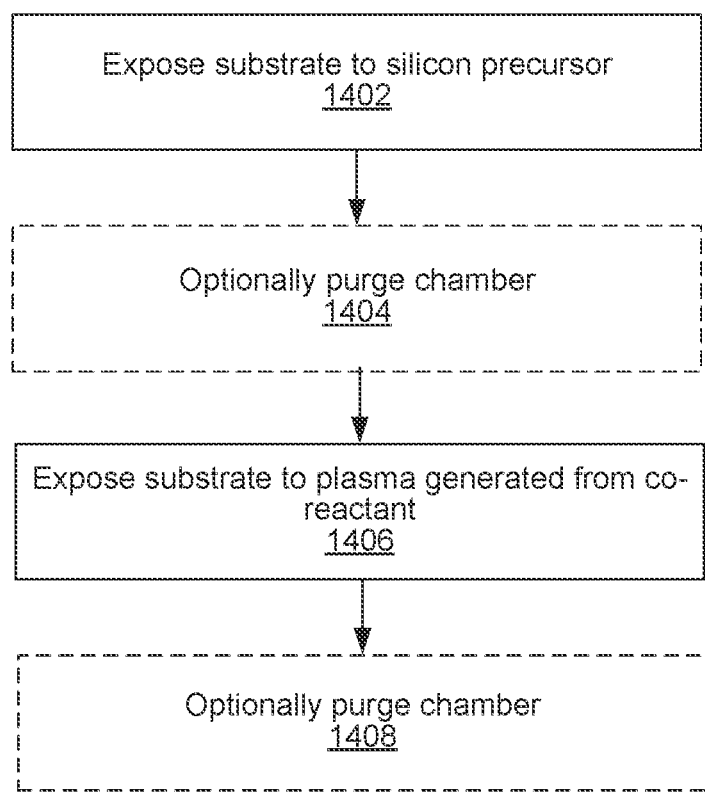
FIG. 14 presents a process flow diagram for a single PEALD cycle that may be implemented as part of deposition of a protective liner or for any of the other ALD operations shown in FIG. 12b.

Deposition of the protective liner by the methods described herein can result in the thickness tapering down from the top of the gap to its deepest point. Etch rates decrease with increasing depth such that a tapered protective liner may be removed without etching the underlying layer FIG. 14 presents a process flow diagram for a single PEALD cycle that may be implemented as part of deposition of a protective liner or for any of the other ALD operations shown in FIG. 12a. In an operation 1402, the substrate is exposed to a silicon-containing precursor, to adsorb the precursor onto the surface of the feature. This operation may be self-limiting. In some embodiments, the precursor adsorbs to less than all the active sites on the surface of the feature. In an operation 1404, the process chamber is optionally purged to remove any unadsorbed silicon-containing precursors. As described above, in some embodiments, the substrate continues to be exposed to a flow including the silicon-containing precursor during the purge.

In an operation 1406, the substrate is exposed to a plasma generated from a co-reactant. Examples include $O_2$ and/or $N_2O$ to form a silicon oxide layer or silicon oxynitride layer, nitrogen ($N_2$) or ammonia ($NH_3$) to form a silicon nitride layer, methane ($CH_4$) to generate a silicon carbide layer, etc. As described above, in some embodiments, the substrate continues to be exposed to a flow including the silicon-containing precursor during this operation. Also as described above, in the same or other embodiments, the plasma is an RF-generated plasma generated using LF and HF voltages.

In operation 1408, the process chamber is optionally purged to remove byproducts from the reaction between the silicon-containing precursor and the co-reactant. As described above, in some embodiments, the substrate continues to be exposed to a flow including the silicon-containing precursor during this operation. Operations 1402 through 1408 are repeated for a number of cycles to deposit the silicon-containing layer to a desired thickness in the feature.

It should be noted that the processes described herein are not limited to a particular reaction mechanism. Thus, the process described with respect to FIG. 14 includes all deposition processes that use sequential exposures to silicon-containing precursors and conversion plasmas, including those that are not strictly self-limiting. The process includes sequences in which one or more gases used to generate a plasma is continuously flowed throughout the process with intermittent plasma ignitions.

Figure 15:
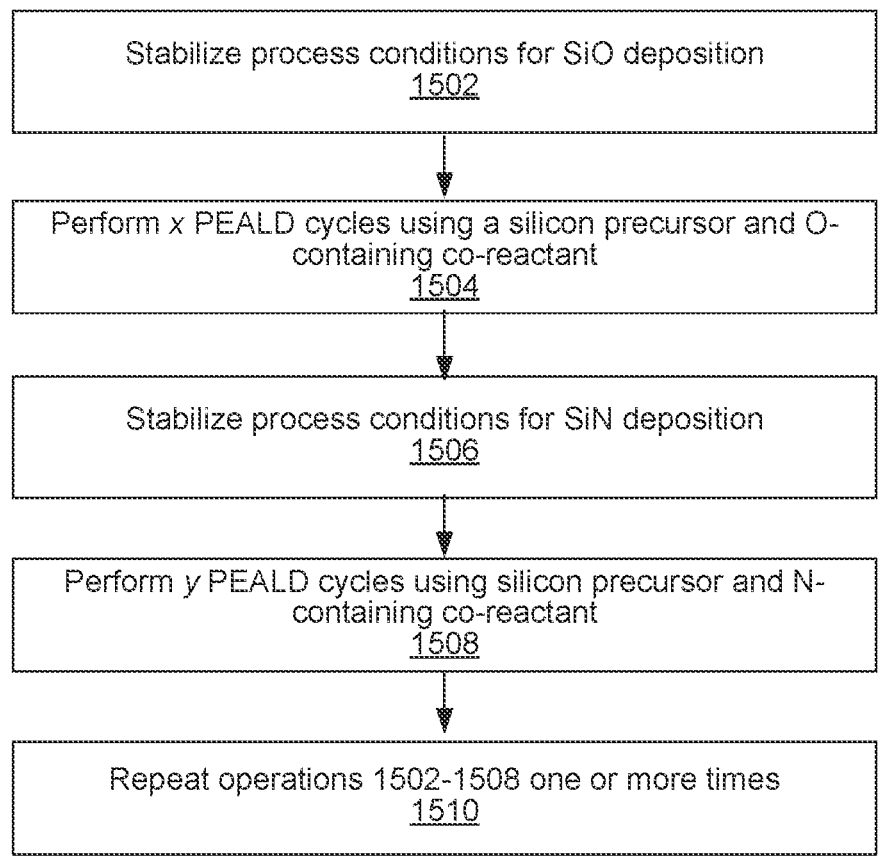
FIG. 15 is a process flow diagram for a method of forming a silicon oxynitride layer.

Another aspect of the disclosure relates to a method of forming a silicon oxynitride layer by PEALD. As used herein, silicon oxynitride (SiON) refers to $SiO_xN_y$ wherein x and y are numbers greater than zero. FIG. 15 is a process flow diagram for a method of forming a silicon oxynitride layer. First, in an operation 1502, process conditions are stabilized for SiO deposition. This involves changes gas flows and stabilizing flow rates into a chamber or station of a chamber as described above. In some embodiments, it can involve stabilizing a chamber pressure. As discussed further below, the substrate temperature and/or chamber pressure may be the same as in a previous operation and may not need to be stabilized.

Next, x PEALD cycles using a silicon-containing precursor and oxygen-containing (O-containing) co-reactant are performed in an operation 1504. As described further below, the number of cycles x may be determined by the amount of oxygen to be incorporated into the deposited film and if the deposited film is a homogenous SiON film or a layered SiO/SiN film. In some embodiments, x is an integer from 1 to 15, or 1 or 10, or 1 to 7, including endpoints.

Once the x cycles have been performed, process conditions with the chamber are stabilized for SiN deposition in an operation 1506. Operation 1506 includes changing and stabilizing gas flows and may further include changing chamber pressure. As discussed further below, the substrate temperature and/or chamber pressure may be the same as in a previous operation and may not need to be stabilized.

Next, y PEALD cycles using a silicon-containing precursor and nitrogen-containing (N-containing) co-reactant are performed in an operation 1508. The N-containing reactant typically does not contain any oxygen, with no O-containing reactants used during operation 1508. As described further below, the number of cycles y may be determined by the amount of nitrogen to be incorporated into the deposited film and if the deposited film is a homogenous SiON film or a layered SiO/SiN film. In some embodiments, y is an integer from 1 to 15, or 1 or 10, or 1 to 7, including endpoints.

In an operation 1501, operations 1502-1508 are then repeated one or more times to build up the film thickness. According to various embodiments, the entire process shown in FIG. 15 is performed in the same chamber, and in some embodiments, the same station of a multi-station chamber. In some embodiments, different stations may be used for different process operations.

Fine control of the incorporation of nitrogen into a SiON film can be used to control the dry etch rate of the film, with more nitrogen generally resulting a more etch resistant film. The ratio of x: y can be used to tune the relative amounts of O and N in the film. In some embodiments, each of the number of cycles x and y and the total number of cycles x+y before repeating the SiO and SiN depositions is kept low enough that the deposited film is a homogenous SiON film. In embodiments in which SiO and SiN are discrete alternating layers, the numbers of cycles can be increased. According to various embodiments, the ratio x:y may range from 1:10 to 10:1. Other ratios may be used.

In some embodiments, chamber pressure is changed in operations 1502 and 1506. In the other embodiments, the same chamber pressure is used Plasma duration during the PEALD cycles of operation 1508 (using a nitrogen-based plasma) are much longer than those of operation 1504 (using an oxygen-based plasma). For example, it be at least twice as long, at least 3 times as long, at least 5 times as long, or at least 7 times as long. According to various embodiments, the silicon-containing precursor used in operation 1504 may be the same or different as used in operation 1508.

According to various embodiments, operation 1502 may involve stopping a flow of nitrogen ($N_2$) or other non-oxygen-containing nitrogen-containing reactant(s) from entering a processing station. This can involve stopping or diverting flow from a manifold, for example. It may further involve starting a flow of oxidant (e.g., $O_2$ and/or $N_2O$) from a manifold with divert. It may further involve starting a flow of silicon-containing precursor to the processing station. This can involve opening a valve from a silicon-containing precursor gas source, for example valve 412 in FIG. 4, without divert. In some embodiments, the valve may be opened or left open during an RF purge operation of operation 1508.

According to various embodiments, operation 1506 may involve stopping a flow of oxygen ($O_2$) or other oxygen reactant(s) from entering a processing station. This can involve stopping or diverting flow from a manifold, for example. It may further involve starting a flow of non-oxygen-containing nitrogen-containing reactant (e.g., $N_2$) from a manifold with divert. It may further involve starting a flow of silicon-containing precursor to the processing station. This can involve opening a valve from a silicon-containing precursor gas source, for example valve 412 in FIG. 4, without divert. In some embodiments, the valve may be opened or left open during an RF purge operation of operation 1504.

Figure 16A:
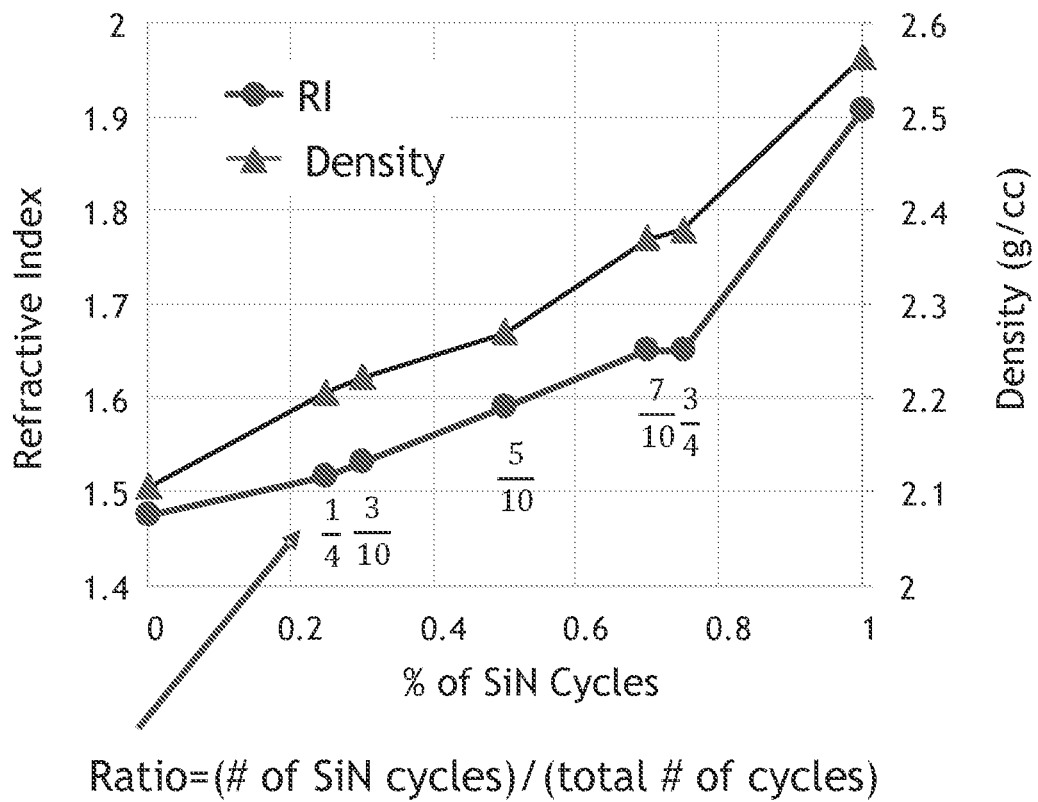
FIG. 16A shows refractive index (RI) and density for films deposited using various numbers of SiN cycles in a method according to FIG. 15.

FIG. 16A shows refractive index (RI) and density, which inversely correlate to etch rate, for films deposited using various numbers of SiN cycles in a method according to FIG. 15. As can be seen from FIG. 16A, the RI and the density (and thus the dry etch rate) can be tuned with a fairly broad window by increasing or decreasing the number of SiN cycles relative to total SiN and SiO cycles.

Figure 16B:
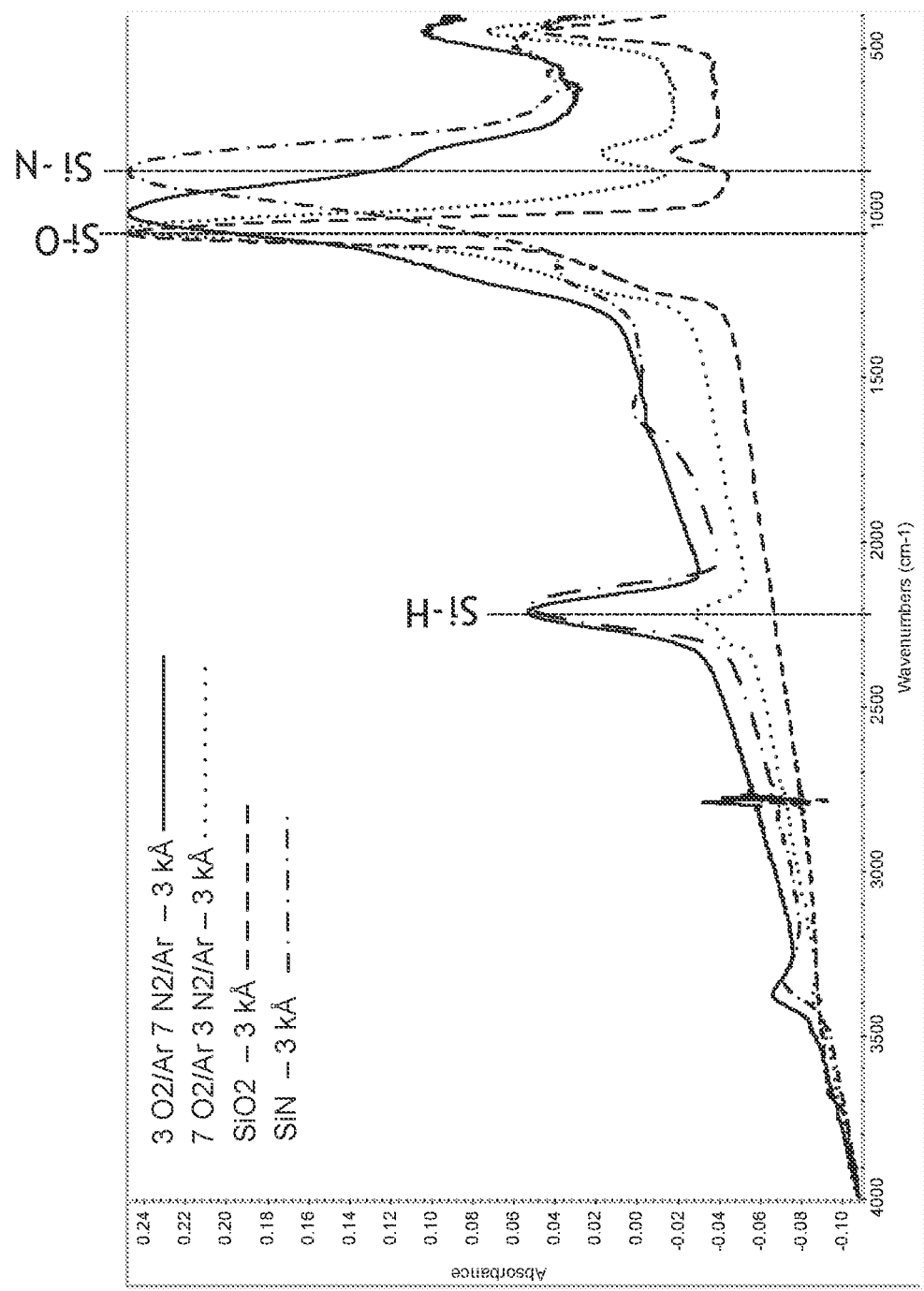
FIG. 16B shows FTIR spectra for four 3 kÅ thick films deposited using methods described herein

FIG. 16B shows FTIR spectra for four 3 kÅ thick films—one $SiO_2$ film, one SiN film, one SiON film deposited using a method as shown FIG. 15 with 3 oxidant cycles to 7 nitridant cycles for each iteration, and a SiON film deposited using a method as shown in FIG. 15 with 7 oxidant cycles to 3 nitridant cycles for each iteration. For the films deposited using both $O_2$/Ar plasma and $N_2$/Ar plasma operations, the peaks are between the $SiO_2$ and SiN peaks, indicating that the films are mixed SiON films and not layered $SiO_2$/SiN films.

Figure 16C:
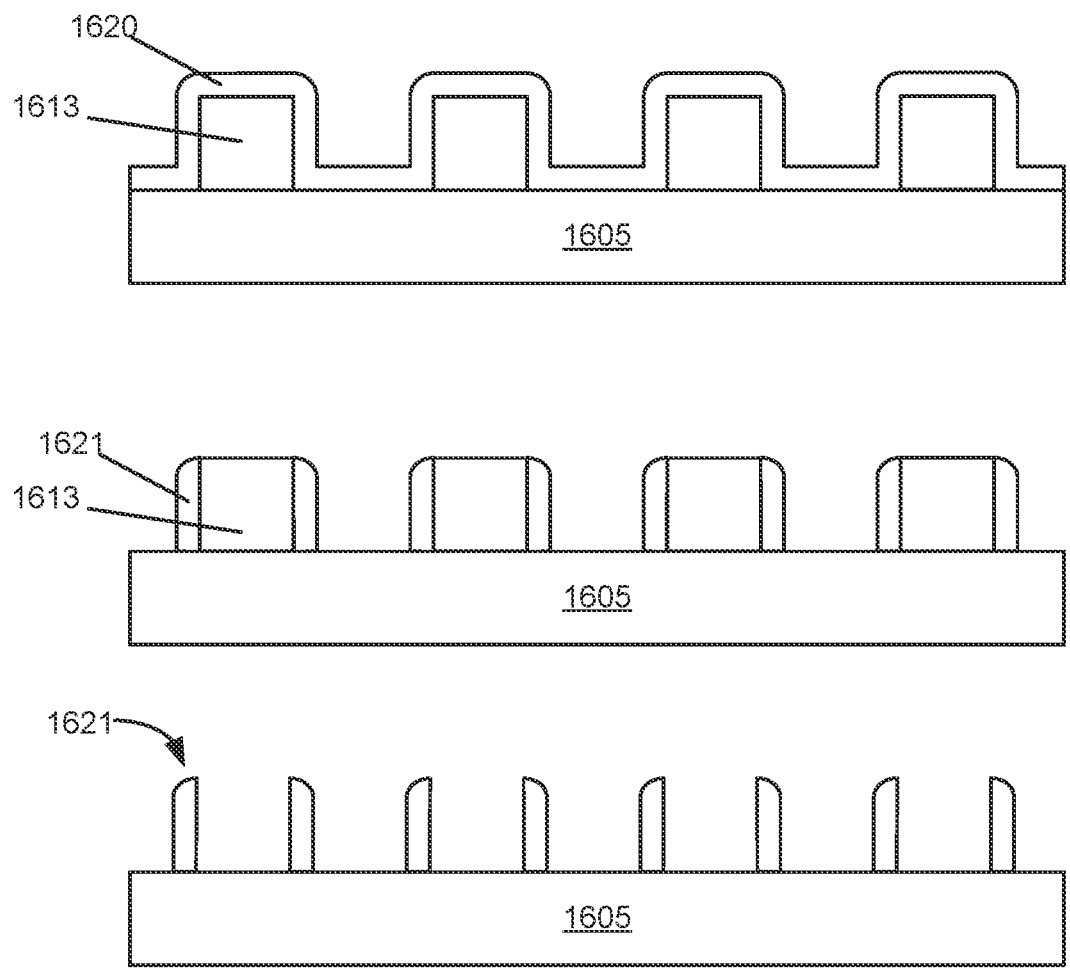
FIG. 16C shows a schematic example of a SiON film having a tuned composition and dry etch rate conformally deposited on a patterned layer.

The SiON films described herein may be used in a variety of applications including as spacers in patterning schemes. For example, a SiON film may be deposited over a patterned core material that overlies a target layer to be etched. In some embodiments, the patterned core material may be a carbon-based structure such as an amorphous carbon structure. The SiON film may be deposited to conformally coat the patterned core material. FIG. 16C shows an example of a SION film 1620 having a tuned composition and dry etch rate conformally deposited on a patterned layer 1613. Examples of materials for the patterned layer 1613 include amorphous carbon, amorphous silicon, and photoresist. The conformal film 1620 is directionally etched to form spacers 1621 flanking the patterned first layer 1613. The patterned first layer 1613 is selectively removed to leave free-standing spacers 1621. The spacers 221 may provide a mask with an even smaller CD for forming features with an even smaller pitch in the underlying layer 1605. As the SiON film 1620 may undergo several precise etch operations in a pattern transferring scheme, being able to tune the dry etch rate as described above is advantageous.

For depositing a silicon-containing film as described above with reference to FIGS. 1-16C, one or more silicon-containing precursors may be used. The silicon-containing reactant may react with a co-reactant to form the silicon-containing film (e g., $SiO_2$, SiN, SiON, SiC, SiOC, etc.) Silicon-containing precursors suitable for use in accordance with disclosed embodiments include polysilanes ($H_3Si$—$(SiH_2)_n$—$SiH_3$), where n≥0 Examples of silanes are silane ($SiH_4$), disilane ($Si_2H_6$), and organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like.

A halosilane includes at least one halogen group and may or may not include hydrogens and/or carbon groups. Examples of halosilanes are iodosilanes, bromosilanes, chlorosilanes, and fluorosilanes. Specific chlorosilanes are tetrachlorosilane, trichlorosilane, dichlorosilane, monochlorosilane, chloroallylsilane, chlorometbylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like.

An aminosilane includes at least one nitrogen atom bonded to a silicon atom, but may also contain hydrogens, oxygens, halogens, and carbons. Examples of aminosilanes are mono-, di-, tri- and tetra-aminosilane ($H_3Si(NH_2)$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tert-butylamino) silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)$). In some embodiments, an aminosilane that has two or more amine groups attached to the central Si atom may be used. These may result in less damage than aminosilanes having only a single amine group attached.

Further examples of silicon-containing precursors include trimethylsilane (3MS); ethylsilane; butasilanes; pentasilanes, octasilanes; heptasilane; hexasilane; cyclobutasilane; cycloheptasilane; cyclohexasilane; cyclooctasilane; cyclopentasilane; 1,4-dioxa-2,3,5,6-tetrasilacyclohexane; diethoxymethylsilane (DEMS); diethoxysilane (DES); dimethoxymethylsilane; dimethoxysilane (DMOS); methyldiethoxysilane (MDES); methyl-dimethoxysilane (MDMS); octamethoxydodecasiloxane (OMODDS); tert-butoxydisilane; tetramethylcyclotetrasiloxane (TMCTS); tetraoxymethylcyclotetrasiloxane (TOMCTS); triethoxysilane (TES); triethoxysiloxane (TRIES); and trimethoxysilane (TMS or TriMOS).

In some implementations silicon-containing precursors may include siloxanes or amino-group-containing siloxanes. In some embodiments, siloxanes used herein may have a formula of $X(R^1)_aSi$—O—$Si(R^2)_bY$, where a and b are integers from 0 to 2, and X and Y independently can be H or $NR^3R^4$, where each of $R^1$, $R^2$, $R^3$ and $R^4$ is hydrogen, unbranched alkyl, branched alkyl, saturated heterocyclic, unsaturated heterocyclic groups, or combinations thereof. In some embodiments, when at least one X or Y is $NR^3R^4$, $R^3$ and $R^4$, taken together with the atom to which each are attached, form a saturated heterocyclic compound. In some embodiments, the silicon-containing precursors are pentamethylated amino group containing siloxanes or dimethylated amino group containing siloxanes. Examples of amino group containing siloxanes include: 1-diethylamino 1,1,3,3,3,-pentamethyl disiloxane, 1-diisopropylamino-1,1,3,3,3,-pentamethyl disiloxane, 1 dipropylamino-1,1,3,3,3,-pentamethyl disiloxane, 1-di-n-butylamino-1,1,3,3,3,-pentamethyl disiloxane, 1-di-sec-butylamino-1,1,3,3,3,-pentamethyl disiloxane, 1-N-methylethylamino 1,1,3,3,3,-pentamethyl disiloxane, 1-N-methylpropylamino-1,1,3,3,3,-pentamethyl disiloxane, 1 N-methylbutylamino-1,1,3,3,3,-pentamethyl disiloxane, 1-t-butylamino-1,1,3,3,3,-pentamethyl disiloxane, 1-piperidino-1,1,3,3,3,-pentamethyl disiloxane, 1-dimethylamino-1,1-dimethyl disiloxane, 1-diethylamino-1,1-dimethyl disiloxane, 1-diisopropylamino-1,1-dimethyl disiloxane, 1-dipropylamino-1,1-dimethyl disiloxane, 1-di-n-butylamino-1,1-dimethyl disiloxane, 1-di-sec butylamino-1,1-dimethyl disiloxane, 1-N-methylethylamino-1,1-dimethyl disiloxane, 1-N methylpropylamino-1,1-dimethyl disiloxan,e 1-N-methylbutylamino-1,1-dimethyl disiloxane, 1 piperidino-1,1-dimethyl disiloxane, 1-t-butylamino-1,1-dimethyl disiloxane, 1-dimethylamino-disiloxane, 1-diethylamino-disiloxane, 1-diisopropylamino-disiloxane, 1-dipropylamino-disiloxane, 1-di-n-butylamino-disiloxane, 1-di-sec-butylamino-disiloxane, 1-N methylethylamino-disiloxane, 1-N-methylpropylamino-disiloxane, 1-N-methylbutylamino-disiloxane, 1-piperidino-disiloxane, 1-t-butylamino disiloxane, and 1-dimethylamino-1,1,5,5,5,-pentamethyl disiloxane.

In addition to a silicon-containing precursor, one or more other gases, including inert gases such as argon, nitrogen, helium, hydrogen, or combinations thereof, may also be flowed. In various embodiments, argon gas may be introduced using a flow rate between about 1 slm and about 20 slm. In some embodiments, nitrogen gas is introduced using a flow rate between about 0 slm and about 30 slm (with the understanding that 0 slm refers to no nitrogen gas being flowed). In some embodiments, hydrogen gas is introduced using a flow rate between about 0 slm and about 5 slm (with the understanding that 0 slm refers to no hydrogen gas being flowed).

Plasma energy may be provided to activate the second reactant into ions and radicals and other activated species, which react with the adsorbed layer of adsorbed precursor and any precursor present in the vapor phase. In various embodiments, the plasma is an in-situ plasma, such that the plasma is formed directly above the substrate surface in the chamber. The in-situ plasma may be ignited at a power per substrate area between about $0.2122$ $W/cm^2$ and about $2.122$ $W/cm^2$, or between about $0.4421$ $W/cm^2$ and about $1.7684$ $W/cm^2$. For example, the power for a single wafer may range from about 150 W to about 6000 W, or from about 500 W to about 6000 W, or from about 600 W to about 6000 W, or from about 800 W to about 4000 W, or from about 310 W to about 1250 W. The power for four 300 mm wafers may range from about 150 W to about 6000 W, or from about 1250 W to about 5000 W. Ranges described herein are inclusive of their end points.

Plasmas for ALD processes may be generated by applying a radio frequency (RF) field to a gas using two capacitively coupled plates. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. Unless otherwise stated, the processing details recited herein (e.g., flow rates, power levels, etc.) are relevant for processing 300 mm diameter substrates, or for treating chambers that are configured to process 300 mm diameter substrates and can be scaled as appropriate for substrates or chambers of other sizes.

Figure 17:
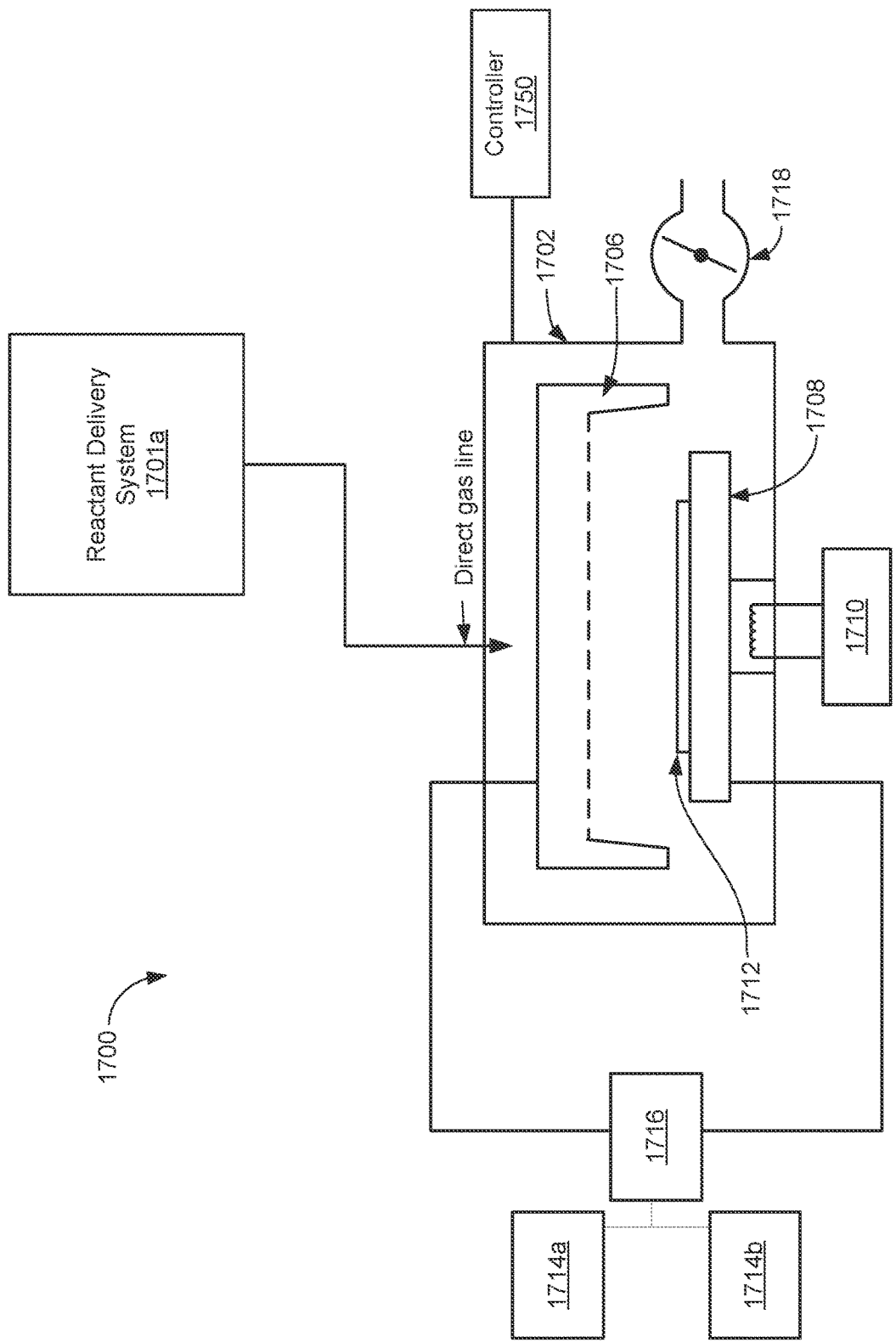
FIG. 17 depicts a schematic illustration of an embodiment of a plasma enhanced atomic layer deposition (PEALD) process station that may be used to implement methods described herein.

FIG. 17 depicts a schematic illustration of an embodiment of a plasma enhanced atomic layer deposition (PEALD) process station 1700 having a process chamber body 1702. The PEALD process station 1700 may be suitable for processing substrates in a low-pressure environment in some embodiments. In some embodiments, one or more hardware parameter values of PEALD process station 1700, including those discussed in detail below may be adjusted programmatically by one or more computer controllers 1750.

The PEALD process station 1700 fluidly communicates with reactant delivery system 1701a for delivering process gases to a distribution showerhead 1706. The reactant delivery system 1701a may include one or more manifolds as described above with reference to FIG. 1 or below with reference to FIG. 18, mixing vessels, mass flow controllers, liquid flow controllers and valves. In various embodiments, delivery of one or more process gases to the showerhead 1706 or to the process chamber 1702 may be varied across cycles. For example, the duration of dosing one or more process gases may be varied. In disclosed embodiments, a controller 1750 may control the delivery of one or more process gases by controlling one or more inlet valves, divert valves, and outlet valves.

Showerhead 1706 distributes process gases toward substrate 1712. In the embodiment shown in FIG. 17, the substrate 1712 is located beneath showerhead 1706 and is shown resting on a pedestal 1708. Showerhead 1706 may have any suitable shape and may have any suitable number and arrangement of ports for distributing process gases to substrate 1712. Optionally, pedestal 408 may be lowered and/or raised during portions the process to modulate process pressure, reactant concentration, plasma density, etc.

The showerhead 1706 and/or pedestal 1708 electrically communicate with a high frequency radio frequency (HFRF) power supply 1714a and a low frequency radio frequency (LFRF) through a matching network 1716 for powering a plasma. In some embodiments, the plasma energy may be controlled by controlling one or more of a process station pressure, a gas concentration, an RF source power, an RF source frequency, and a plasma power pulse timing. Such parameter values may be varied from ALD cycle to ALD cycle in a multi-cyclic ALD process as described herein. For example, LFRF power supply 1714b and matching network 1716 may be operated at any suitable power to for desired sputtering effect during one or more ALD cycles. Examples of suitable powers are included above. Example low-frequency RF frequencies may include, but are not limited to, frequencies between 50 KHz and 500 kHz. Example high-frequency RF frequencies may include, but are not limited to, frequencies between 1.8 MHz and 2.45 GHz.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameter values may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 1750 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameter values may be included in a recipe phase. For example, a first recipe phase may include instructions for setting a flow rate of an inert and/or a reactant gas (e.g., the first precursor such as silane), instructions for setting a flow rate of a carrier gas (such as nitrogen or argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for setting a flow rate of an inert and/or reactant gas which may be the same as or different from the gas used in the first recipe phase (e.g., the second precursor such as oxygen), instructions for setting a plasma HFRF power, instructions for setting a plasma LFRF power, instructions for modulating a flow rate of a carrier gas which may be the same as or different from the flow rate in the first recipe phase, plasma conditions, and time delay instructions for the third recipe phase. A fourth recipe phase may include instructions for modulating or stopping a flow rate of an inert and/or a reactant gas, instructions for modulating the flow rate of a carrier or purge gas, and time delay instructions for the fourth recipe phase. A fifth recipe phase may include instructions for setting a flow rate of an inert and/or reactant gas (e.g., oxygen and/or argon), instructions for setting a different or same plasma LFRF and/or HFRF power, instructions for modulating a flow rate of a carrier gas, plasma conditions, and time delay instructions for the fifth recipe phase for performing an intermittent plasma treatment. In some cases, the recipe phase may also include instructions for pulsing the plasma between ON and OFF states. More recipe phases may also be used. It will be appreciated that these recipe phases may be further subdivided and/or iterated in any suitable way within the scope of the present disclosure.

In some embodiments, pedestal 1708 may be temperature controlled via heater 1710. Further, in some embodiments, pressure control for process station 1700 may be provided by butterfly valve 1718. As shown in the embodiment of FIG. 17, butterfly valve 1718 throttles a vacuum provided by a downstream vacuum pump (not shown). However, in some embodiments, pressure control of process station 1700 may also be adjusted by varying a flow rate of one or more gases introduced to the process station 1700. The process station 1700 may include a control 1750 for controlling example recipes as described above.

In some implementations, a controller 1750 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 1750, depending on the processing requirements and/or the type of system, may be programmed to control any of the processes disclosed herein, including the delivery of processing gases and/or variation of different dose times for delivery of process gases including diversion of one or more gases, temperature settings (e.g., heating and/or cooling), pressure settings, vacuum settings, power settings, RF generator settings and/or variation of RF power settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 1750 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 450 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 1750, in some implementations, may be a part of or coupled to a computer that is integrated with, coupled to the system, otherwise networked to the system, or a combination thereof. For example, the controller 1750 may be in the "cloud" or all or a part of a fab host computer system, which can allow for remote access of the wafer processing The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 1750 receives instructions in the form of data, which specify parameters for each of the processing steps to be performed during one or more operations. It should be understood that the parameters may be specific to the type of process to be performed and the type of tool that the controller 1750 is configured to interface with or control. Thus as described above, the controller 1750 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 1750 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The methods described herein may be implemented using a multi-station or single station substrate processes apparatus. In some embodiments of a multi-station substrate processing apparatus, control and/or supply of various process inputs (e.g., process gases, plasma power, gases for plasma generation, reactants, film precursors, heater power, etc.) may be distributed from shared sources to the plurality of processing stations within the multi-station apparatus. For example, in some embodiments, a shared source of RF power may supply RF power for plasma generation within two or more processing stations. In another example, a shared gas distribution manifold may supply process gases to two or more processing stations. Some non-limiting example embodiments of multi-station processing tools are described below.

Figure 18:
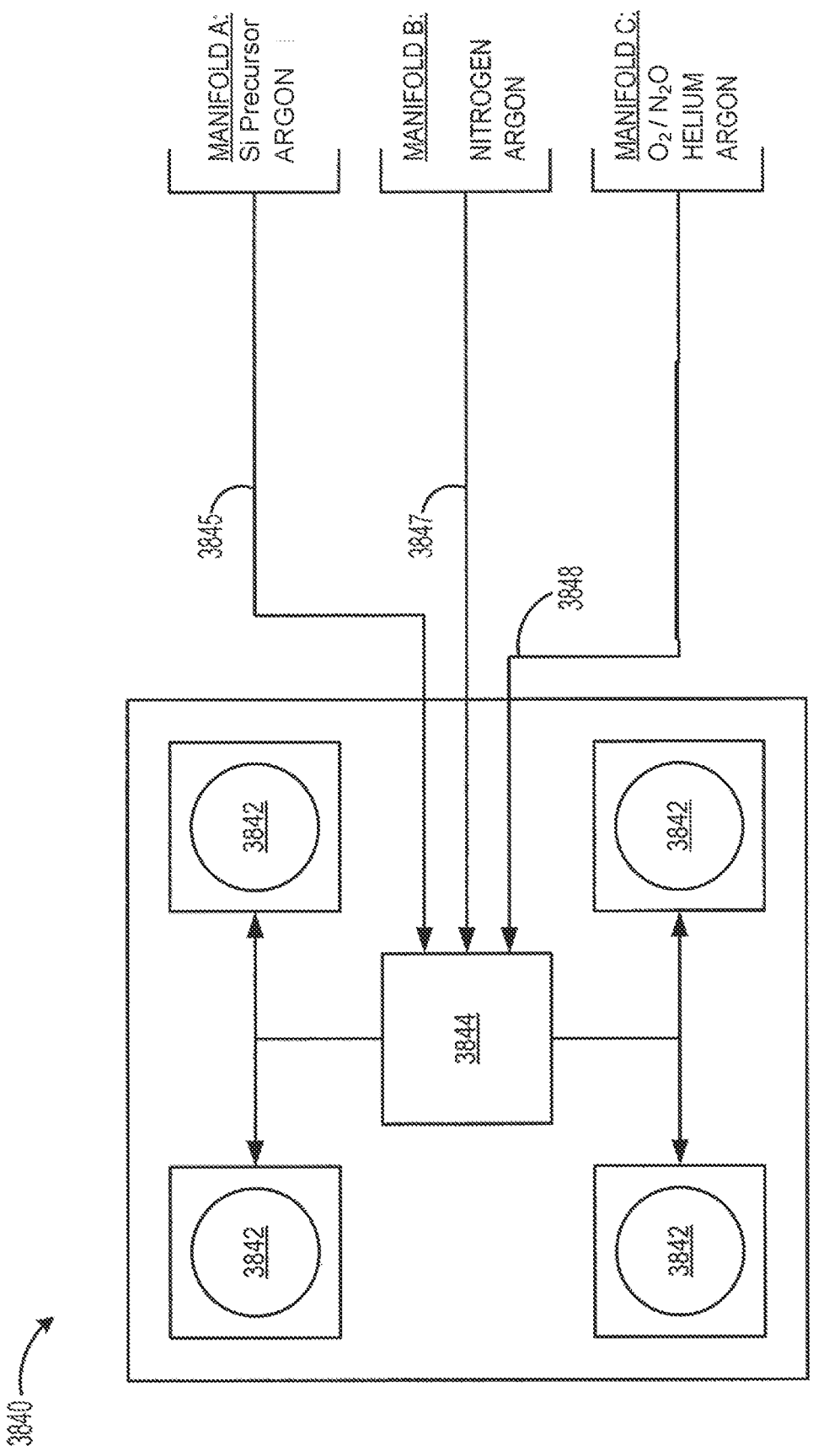
FIG. 18 schematically shows an example substrate processing apparatus that may be used to implement the methods described herein.

FIG. 18 schematically shows an example substrate processing apparatus 3840, which includes a plurality of processing stations 3842 in a common low-pressure reaction chamber. By maintaining each station in a low-pressure environment, defects caused by vacuum breaks between film deposition processes may be avoided In the example shown in FIG. 18, each processing station 3842 is configured to deposit a silicon-containing film as described above. In the embodiment depicted in FIG. 18, process gases for each processing station 3842 are supplied by a common mixing vessel 3844 for blending and/or conditioning process gases prior to delivery. In some embodiments, mixing vessel 3844 may be temperature controlled. Process gases, including film precursors (such as silicon-containing film precursor) and possibly other reactants in a carrier gas, as well as gases for plasma support, may be supplied from a plurality of process gas delivery lines, valves, and manifolds. For example, FIG. 18 depicts a manifold A including a silicon-precursor/argon mixture and argon (as the carrier gas) fluidly communicating with a delivery line 3845; a manifold B including nitrogen and argon (again, serving as a carrier gas) fluidly communicating with an delivery line 3847; and a manifold C including oxygen gas ($O_2$) and/or nitrous oxide ($N_2O$), helium, and/or argon (the latter two as carrier gases) fluidly communicating with delivery line 3848. It should be appreciated that other suitable arrangements and chemistries (as described above) are included within the scope of the present disclosure, and that various ALD-based film deposition chemistries and multi-substrate apparatuses and arrangements may benefit from the process timing sequences disclosed herein. In some embodiments, separate mixing vessels may be employed, separating incompatible reactants and precursors.

While FIG. 18 depicts a multi-station substrate processing apparatus having four processing stations within a single reaction chamber, other configurations may have a greater or lesser number of processing stations within a single reaction chamber. Thus, for example, in some embodiments, a multi-station substrate processing apparatus may have 2, 3, 4, 5, 6, 7, 8, 9, 10, 11, 12, 13, 14, 15, or 16, or more processing stations per reaction chamber; or a number of processing stations per reaction chamber within a range defined by any pair of the foregoing numbers of processing stations per reaction chamber: e.g., 2 to 6 processing stations per reaction chamber, 4 to 8 processing stations per reaction chamber, 8 to 16 processing stations per reaction chamber, etc.

In other embodiments, a substrate processing apparatus may have just a single processing station per reaction chamber.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
    providing a substrate in a processing station comprising a substrate support and a showerhead, the substrate comprising a gap to be filled; and
    depositing silicon-containing film in the gap by a plasma-enhanced atomic layer deposition (PEALD) process comprising multiple cycles of operations (a)-(d):
        (a) a dose operation comprising flowing a silicon-containing precursor into the processing station via the showerhead to allow the silicon-containing precursor to adsorb onto the substrate;
        (b) after (a), flowing a purge gas into the processing station;
        (c) after (b), exposing the substrate to plasma species to react with the adsorbed silicon-containing precursor; and
        (d) after (c), flowing a purge gas into the processing station,
        wherein the silicon-containing precursor continues to flow into the processing station during at least (b).

2. The method of claim 1, wherein the silicon-containing precursor continues to flow into the processing station during at least part of (c).

3. The method of claim 1, wherein the silicon-containing precursor continues to flow into the processing station during (c) and at least part of (d).

4. The method of claim 1, wherein after (a), the silicon-containing precursor flow continues into flow into the processing station at a decreasing flow rate.

5. The method of claim 1, wherein (a) comprises flowing an inert gas and a vaporized silicon-containing precursor from a silicon-containing precursor source fluidically connected to a gas delivery line via an outlet valve, the gas delivery line fluidically connected to the showerhead, and at the end of (a), closing the outlet valve.

6. The method of claim 5, wherein silicon-containing precursor in the gas delivery line continues to flow into the processing station after the outlet valve is closed.

7. The method of claim 1, further comprising diverting silicon-containing precursor from the processing station during one or more of (c) and (d).

8. The method of claim 1, wherein the plasma in (c) is a dual frequency RF plasma generated using high frequency (HF) and low frequency (LF) RF power.

9. The method of claim 8, further comprising increasing an inert gas flow into the processing station during (c).

10. The method of claim 8, wherein the HF power is at least 4 kW and the LF power is between 500 W and 5 kW.

11. The method of claim 8, further comprising sputtering and re-depositing silicon-containing film in the gap during deposition of the silicon-containing film in the gap.

12. The method of claim 1, wherein the plasma species are generated from oxygen ($O_2$).

13. The method of claim 1, wherein the plasma species are generated from nitrous oxide ($N_2O$).

14. The method of claim 1, wherein the plasma species are generated from nitrogen ($N_2$).

15. The method of claim 1, wherein (b) is between 50-500 milliseconds in duration.

16. The method of claim 1, wherein the gap to be filled is a gap between memory stacks of a 3D NAND structure.

17. The method of claim 1, wherein the gap has aspect ratio of at least 20:1.

18. The method of claim 1, further comprising exposing the deposited film to an inhibition plasma before at least one of the multiple cycles.

19. A method comprising:
providing a substrate in a processing station comprising a substrate support and a showerhead;
depositing a silicon-containing film on the substrate by a plasma-enhanced atomic layer deposition (PEALD) process comprising multiple cycles of operations (a)-(d):
(a) a dose operation comprising flowing a silicon-containing precursor into the processing station via the showerhead to allow the silicon-containing precursor to adsorb onto the substrate;
(b) after (a), flowing a purge gas into the processing station;
(c) after (b), exposing the substrate to plasma species to react with the adsorbed silicon-containing precursor; and
(d) after (c), flowing a purge gas into the processing station,
wherein the plasma in (c) is a dual frequency RF plasma generated using high frequency (HF) and low frequency (LF) RF power.

20. The method of claim 19, wherein the silicon-containing film fills a gap on the substrate.

21. The method of claim 19, wherein the silicon-containing film is a protective film non-conformally deposited on a structure having two stacks separated by a gap such that the protective film is deposited at the top of the stacks extending only partially into gap.

22. The method of claim 21, further comprising: performing one or more cycles of:
exposing the substrate including the protective film to an inhibition plasma comprising halogen species to inhibit deposition on a portion of the gap; and after exposing the substrate to the inhibition, depositing dielectric material in the gap.

23. The method of claim 22, wherein the protective film is etched during exposure to the inhibition plasma.

24. The method of claim 21, wherein the silicon-containing precursor continues to flow into the processing station during at least (b).

25. A method comprising:
providing a substrate in a processing station comprising a substrate support and a showerhead, the substrate comprising a gap to be filled; and
depositing silicon-containing film in the gap by a plasma-enhanced atomic layer deposition (PEALD) process comprising multiple cycles of operations (a)-(d):
(a) a dose operation comprising flowing a silicon-containing precursor into the processing station via the showerhead to allow the silicon-containing precursor to adsorb onto the substrate;
(b) after (a), flowing a purge gas into the processing station;
(c) after (b), exposing the substrate to plasma species generated from a reactant gas to react with the adsorbed silicon-containing precursor; and
(d) after (c), flowing a purge gas into the processing station, wherein the purge gas is a different gas than the reactant gas and
wherein the reactant gas and/or the plasma species continue to flow into the processing station during at least (a).

* * * * *